US012693315B2

(12) United States Patent
Kawahara et al.

(10) Patent No.: US 12,693,315 B2
(45) Date of Patent: Jul. 28, 2026

(54) SHUNT-BASED CURRENT SENSOR

(71) Applicants: DENSO CORPORATION, Kariya-city (JP); TOYOTA JIDOSHA KABUSHIKI KAISHA, Toyota (JP); MIRISE Technologies Corporation, Nisshin (JP)

(72) Inventors: Shogo Kawahara, Nisshin (JP); Yoshikazu Furuta, Nisshin (JP); Tomohiro Nezuka, Nisshin (JP)

(73) Assignees: DENSO CORPORATION, Kariya-city (JP); TOYOTA JIDOSHA KABUSHIKI KAISHA, Toyota (JP); MIRISE Technologies Corporation, Nisshin (JP)

( * ) Notice: Subject to any disclaimer, the term of this patent is extended or adjusted under 35 U.S.C. 154(b) by 161 days.

(21) Appl. No.: 18/825,286

(22) Filed: Sep. 5, 2024

(65) Prior Publication Data

US 2025/0102545 A1      Mar. 27, 2025

(30) Foreign Application Priority Data

Sep. 27, 2023     (JP) ................................. 2023-166004

(51) Int. Cl.
*G01R 19/00*          (2006.01)
*G01R 1/20*            (2006.01)
(52) U.S. Cl.
CPC ......... *G01R 19/0007* (2013.01); *G01R 1/203* (2013.01)

(58) Field of Classification Search
CPC ........... G01R 19/0007; G01R 19/0092; G01R 1/203; G01R 19/04; G01R 19/165; G01R 19/0023; G01R 19/003; G01R 31/56; H02J 7/865; H02J 7/855
See application file for complete search history.

(56) References Cited

U.S. PATENT DOCUMENTS

| | | | |
|---|---|---|---|
| 8,779,777 B2 | 7/2014 | Irmer et al. | |
| 8,947,101 B2* | 2/2015 | Engl ...................... | G01R 27/14 |
| | | | 324/202 |
| 10,473,724 B2 | 11/2019 | Aumer et al. | |
| 10,527,651 B2 | 1/2020 | Wood et al. | |
| 2014/0038009 A1 | 2/2014 | Okawa et al. | |
| 2018/0284163 A1* | 10/2018 | Kaupp ................... | G01R 19/00 |

(Continued)

FOREIGN PATENT DOCUMENTS

EP              3822644 A1      5/2021

*Primary Examiner* — Alvaro E Fortich
(74) *Attorney, Agent, or Firm* — Posz Law Group, PLC

(57) ABSTRACT

A shunt-based current sensor executes redundancy detection of a load current flowing through a load by using a shunt resistor. The shunt-based current sensor includes a reference resistor, a current excitation circuit, at least two voltage measurement circuits and a signal processing circuit. The reference resistor is connected to the shunt resistor in series. The current excitation circuit generates an AC excitation current and supply the AC excitation current to the shunt resistor and the reference resistor. At least two voltage measurement circuits measure a voltage across the shunt resistor. A signal processing circuit executes signal processing based on respective measurement voltages of the at least two voltage measurement circuits, and is operated in the load current redundancy detection mode or a shunt resistance measurement mode.

12 Claims, 13 Drawing Sheets

(56) References Cited

U.S. PATENT DOCUMENTS

| | | | |
|---|---|---|---|
| 2019/0094304 A1* | 3/2019 | Aumer | G01R 15/146 |
| 2021/0173017 A1* | 6/2021 | Schlarb | G01R 19/2506 |
| 2021/0231709 A1* | 7/2021 | Dave | G01R 15/207 |
| 2022/0413017 A1* | 12/2022 | Ebner | G01R 35/005 |

* cited by examiner

SHUNT-BASED CURRENT SENSOR

CROSS REFERENCE TO RELATED APPLICATION

This application is based on Japanese Patent Application No. 2023-166004 filed on Sep. 27, 2023, the disclosure of which is incorporated herein by reference.

TECHNICAL FIELD

The present disclosure relates to a shunt-based current sensor.

BACKGROUND

Electric vehicles (EVs), hybrid electric vehicles (HEVs) and other electrically powered vehicles are equipped with batteries. To estimate the remaining charge of this type of battery, a circuit may be required to measure the current flowing through the battery. A shunt-based current sensor may be provided to measure the current flowing through the battery.

SUMMARY

The present disclosure describes a shunt-based current sensor includes a reference resistor, a current excitation circuit, at least two voltage measurement circuits and a signal processing circuit.

DETAILED DESCRIPTION

Figure 1:
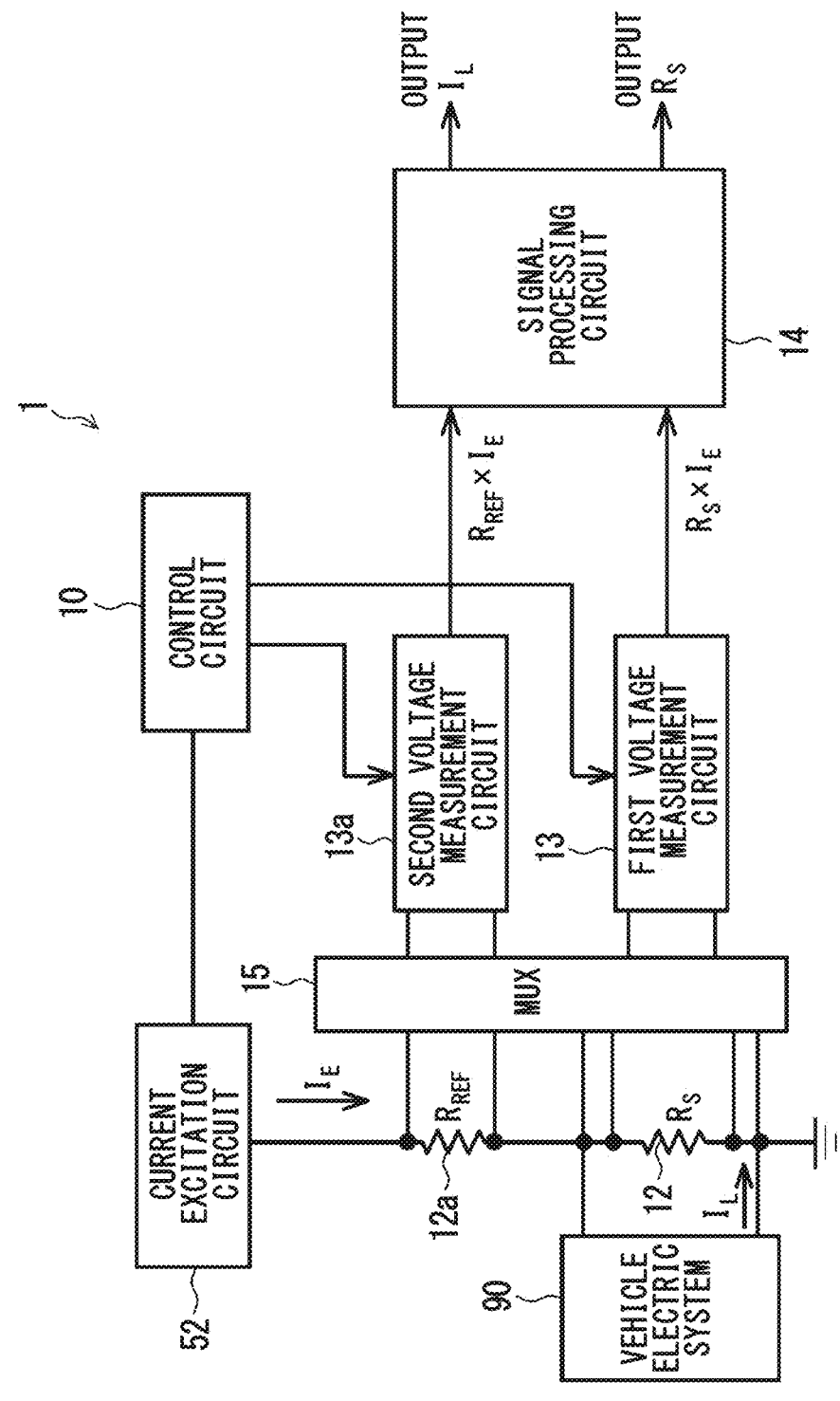
FIG. 1 is an electrical configuration diagram illustrating a shunt-based current sensor according to a first embodiment.

In a shunt-based current sensor, a shunt resistor is connected to the battery in series. The shunt-based current sensor may measure the current by measuring a voltage applied to the shunt resistor. The shunt resistor may change its resistance value over time due to degradation. Accordingly, the shunt-based current sensor may have a situation in which the accuracy degrades due to a change in the resistance value over time. Therefore, by accurately determining the resistance value of the shunt resistor, the current may be measured with higher accuracy. According to a shunt-based current sensor in a comparative example, a highly accurate reference excitation current is applied to a shunt resistor, the voltage across the shunt resistor is measured. The shunt resistance value is calculated from the applied excitation current and the measured voltage across the shunt resistor. Therefore, the shunt resistance value is corrected to improve accuracy.

Two or more voltage measurement circuits are normally provided to measure the voltage across the shunt resistor, thereby enhancing functional safety. The load current may be detected redundantly by two or more voltage measurement circuits in order to measure the voltage across the shunt resistor. When the technique of the comparative example is adopted, a reference current source that generates a highly accurate reference current may be required. A reference current source with small temperature characteristics and small deterioration may not be desirable because the respective physical sizes of a reference diode, a transistor, and a correction circuit may increase. Thus, a high cost may be anticipated. Furthermore, the power supply power for supplying the excitation current tends to become larger, which may be undesirable.

According to an aspect of the present disclosure, a shunt-based current sensor executes redundancy detection of a load current flowing through a load by using a shunt resistor. The shunt-based current sensor includes a reference resistor, a current excitation circuit, at least two voltage measurement circuits and a signal processing circuit. The reference resistor is connected to the shunt resistor in series. The current excitation circuit generates an AC excitation current and supply the AC excitation current to the shunt resistor and the reference resistor. At least two voltage measurement circuits measure a voltage across the shunt resistor. A signal processing circuit executes signal processing based on respective measurement voltages of the at least two voltage measurement circuits, and is operated in the load current redundancy detection mode or a shunt resistance measurement mode. The load current redundancy detection mode is a mode in which the redundancy detection of the load current is executed via measurement of the voltage across the shunt resistor by using the at least two voltage measurement circuits, on a condition that: the AC excitation current is not flowing to the reference resistor and the shunt resistor; and the load current is flowing from the load to the shunt resistor. The shunt resistance measurement mode is a mode in which a resistance value of the shunt resistor is measured according to a voltage across the reference resistor and the voltage across the shunt resistor measured by the at least two voltage measurement circuits, respectively, based on a condition that the AC excitation current is flowing from the current excitation circuit to the reference resistor and the shunt resistor.

The signal processing circuit operates in either a load current redundant detection mode or a shunt resistance measurement mode. In the load current redundant detection mode, the load current flowing through the load is redundantly detected by measuring the voltage across the shunt resistor using two or more voltage measurement circuits while no AC excitation current is flowing from the current excitation circuit to the reference resistor and the shunt resistor and a load current is flowing from the load to the shunt resistor.

In the shunt resistance measurement mode, the resistance value of the shunt resistance is detected based on the voltage of the reference resistance and the voltage of the shunt resistance measured by two or more voltage measurement circuits, respectively, when an AC excitation current from a current excitation circuit flows through the reference resistance and the shunt resistance. It is possible to sense the current flowing through the load with higher accuracy using two or more voltage measurement circuits for functional safety.

The following describes several embodiments related to shunt-based current sensors. In each of the embodiments described below, the same or similar reference numerals are attached to the same or similar configuration, and the description is omitted as necessary.

First Embodiment

Figure 2:
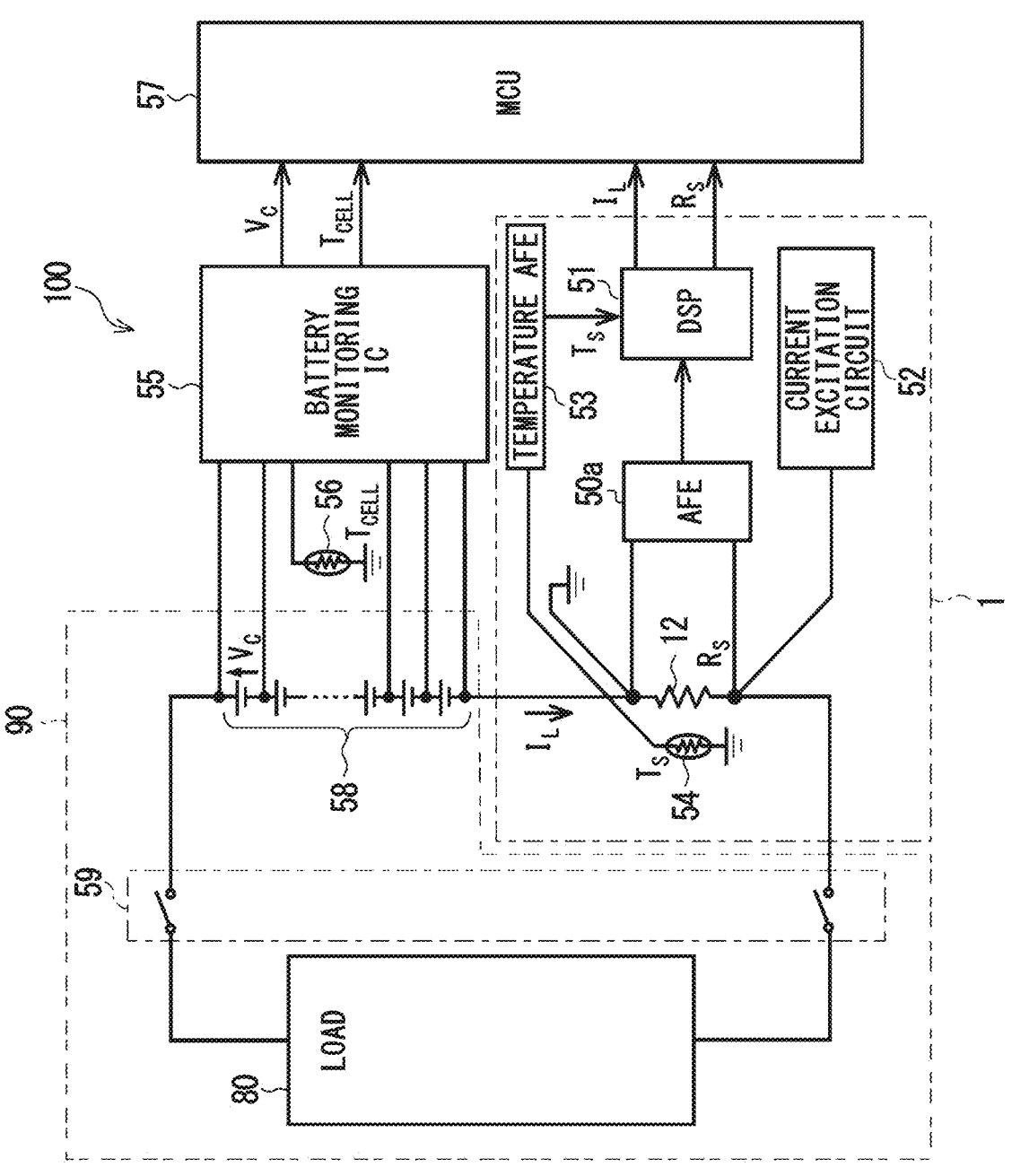
FIG. 2 is an electrical configuration block diagram schematically illustrating a battery monitoring system according to the first embodiment.
Figure 3:
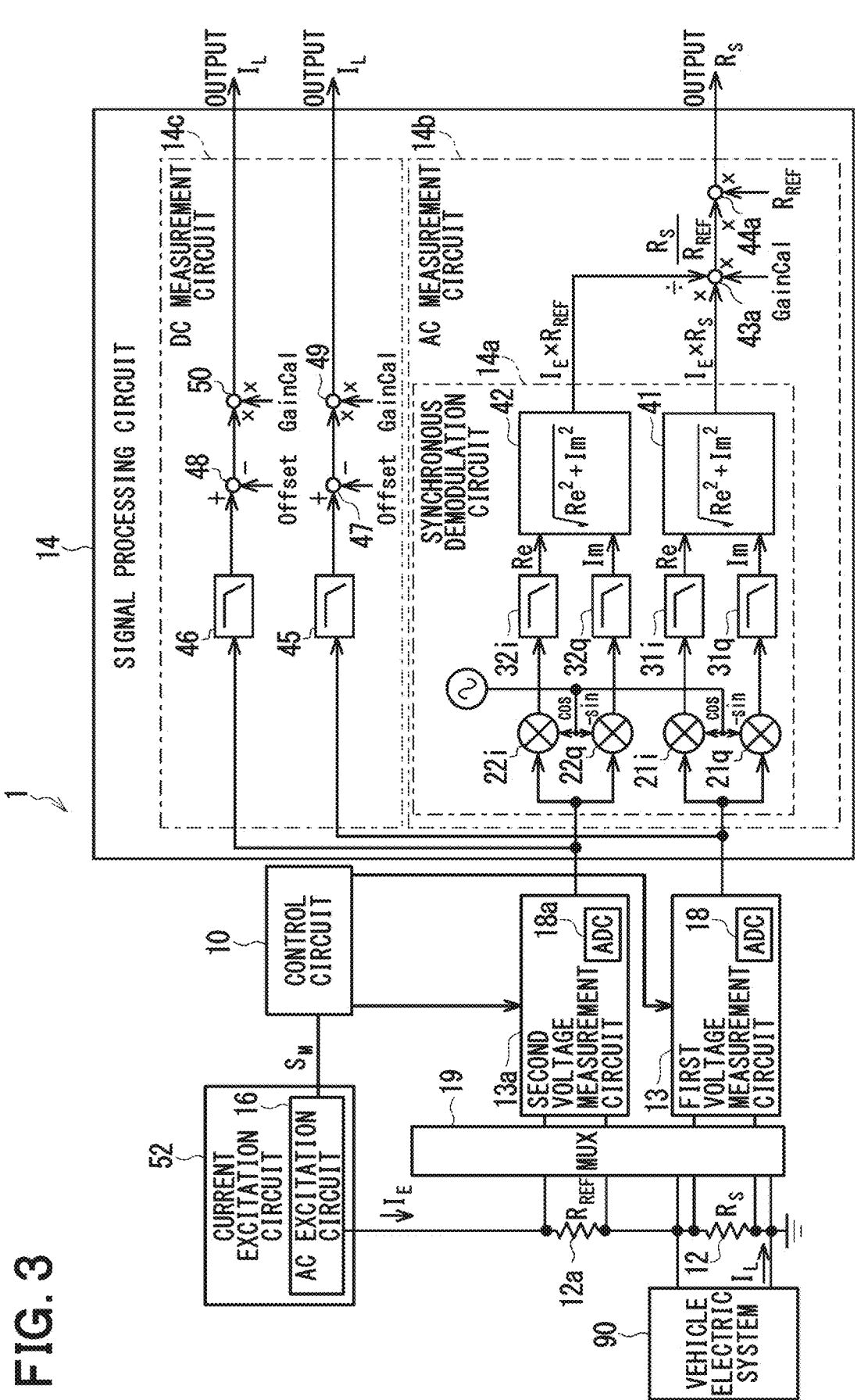
FIG. 3 is an example of a signal processing circuit according to the first embodiment.
Figure 4:
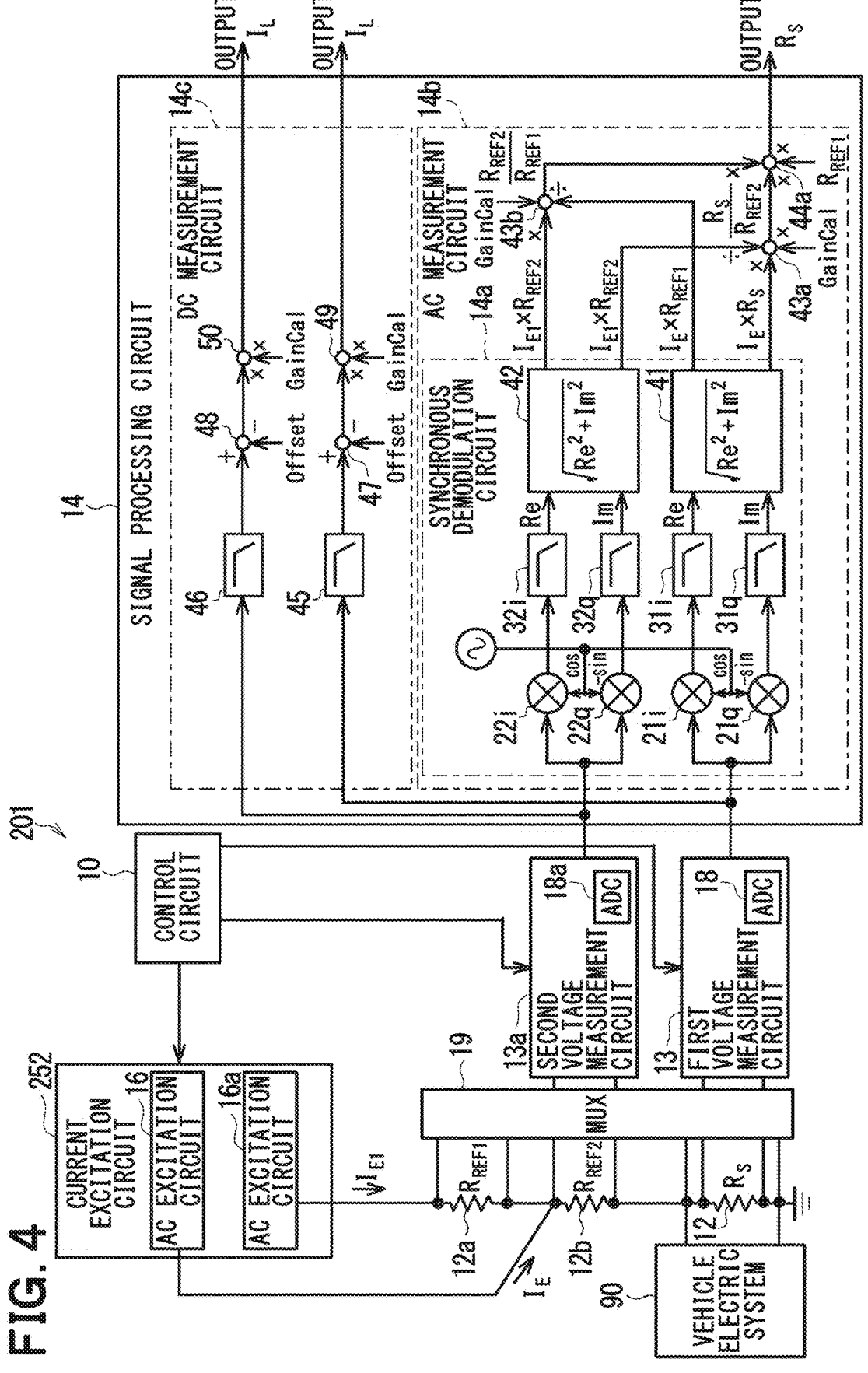
FIG. 4 is an electrical configuration diagram illustrating a shunt-based current sensor according to a second embodiment.

The following describes a first embodiment with reference to FIGS. 1 to 3. FIG. 2 shows a schematic diagram of a battery monitoring system 100. As shown in FIG. 2, the battery monitoring system 100 includes, for example, a battery monitoring integrated circuit 55, a temperature sensor 56, a microcontroller unit (MCU) 57, and a shunt-based current sensor 1. The shunt-based current sensor 1 includes an analog front end (AFE) 50a, a digital signal processor (DSP) 51, a current excitation circuit 52, and an analog front end (AFE) 53 for temperature measurement.

The MCU 57 includes a processor and a memory, and operates based on a program preliminarily stored in the memory. The memory is a non-transitory tangible storage medium.

The current excitation circuit 52 supplies an AC excitation current $I_E$ to a shunt resistor 12. The analog front end 50a is connected between the terminals of the shunt resistor 12. The analog front end 50a measures the voltage across the shunt resistor 12, and performs analog processing. The shunt resistor 12 is connected in series with a battery 58. The shunt resistor 12 is provided to measure the load current $I_L$ flowing through the battery 58 with high accuracy.

The battery 58 is a main battery and/or an auxiliary battery in which battery cells are combined in series or in series-parallel. The battery 58 is provided to drive a load 80 such as a main motor of a vehicle such as an electric vehicle or a hybrid vehicle, or a DC-DC converter, and/or to supply power to a vehicle electronic control device provided within the vehicle.

A relay 59 and a load 80 are connected in series to the battery 58 and the shunt resistor 12. The battery 58, the relay 59 and the load 80 are included in a vehicle electrical system 90. When the ignition switch is turned on by a user to start the vehicle, the relay 59 is turned on. When the relay 59 is turned on, the load 80, the battery 58, and the shunt resistor 12 are connected. As a result, a load current $I_L$ flows through the shunt resistor 12.

The shunt resistor 12 has a resistance in the order of several tens of microohms. When the load current $I_L$ is supplied to the battery 58, a current in the order of several thousand amperes flows through the shunt resistor 12. The resistance value $R_S$ of the shunt resistor 12 changes due to deterioration over time. Therefore, the shunt-based current sensor 1 can accurately measure the load current $I_L$ flowing through the battery 58 by accurately determining the resistance value $R_S$ of the shunt resistor 12 and then correcting for the influence of deterioration over time.

In addition, a temperature sensor 54 is disposed in the vicinity of the shunt resistor 12. The temperature sensor 54 is a thermistor, and is connected to the analog front end 53 for measuring temperature. The analog front end 53 for temperature measurement processes the temperature measurement signal $T_S$ provided from the temperature sensor 54, removes noise by waveform shaping, and outputs the temperature measurement signal $T_S$ to the DSP 51.

The DSP 51 corrects the load current $I_L$ flowing through the shunt resistor 12 and the resistance value $R_S$ of the shunt resistor 12 in accordance with the temperature measurement signal $T_S$, and outputs these values to the MCU 57. The DSP 51 functions as a signal processing circuit 14 shown in FIG. 1.

On the other hand, the integrated circuit 55 is connected to the battery 58 for monitoring the battery cells. The integrated circuit 55 monitors the voltage $V_C$ of each battery cell of the battery 58 and measure the remaining battery charge (SOC). The temperature sensor 56 is also located near the battery 58 and connected to the integrated circuit 55. When the integrated circuit 55 receives a temperature measurement signal $T_{CELL}$ from the temperature sensor 56, the integrated circuit 55 corrects the battery cell voltage $V_C$ in accordance with the temperature measurement signal $T_{CELL}$ and outputs the corrected voltage $V_C$ to the MCU 57. This enables the MCU 57 to monitor the state of each battery cell of the battery 58. The integrated circuit 55 may transmit a temperature measurement signal $T_{CELL}$ to the MCU 57, and the MCU 57 may correct the voltage $V_C$ of the battery cell in response to the temperature measurement signal $T_{CELL}$.

The MCU 57 receives information on the load current $I_L$ and the resistance value $R_S$ of the shunt resistor 12 from the DSP 51. Therefore, the MCU 57 can accurately measure information about the load current $I_L$ flowing through the battery cells included in the battery 58 according to the resistance value RS.

The configuration blocks of the shunt-based current sensor 1 will be described below with reference to FIGS. 1 and 3. The shunt resistor 12 is connected to a vehicle electrical system 90, and the shunt-based current sensor 1 shown in FIG. 1 is provided for measuring the load current $I_L$ flowing through the shunt resistor 12. The path connecting the shunt resistor 12 and the voltage measurement circuits 13, 13a has two pairs of differential paths, each of which is connected via a different path. In addition, in a fourth embodiment described later, an example of the connection mode of the shunt resistor 12 will be described.

A reference resistor 12a is connected in series to the shunt resistor 12. The impedance of the reference resistor 12a is highly accurate, about 10 ohms, while the impedance of the shunt resistor 12 is several tens of micro-ohms, which is approximately six orders of magnitude smaller. As mentioned later, the resistance value $R_S$ of the shunt resistor 12 is measured by taking the ratio of the shunt resistor 12 to the reference resistor 12a. For this reason, it would be easier to make measurements if similar resistance values were selected. However, generally available high-precision, low-degradation reference resistor 12a has a resistance value of 10 ohms or higher. Therefore, the reference resistor 12a and the shunt resistor 12 are constructed using resistors with significantly different resistance values, $R_{REF1}$ and $R_S$, respectively.

The current excitation circuit 52 includes an AC excitation circuit 16 shown in FIG. 3. The AC excitation circuit 16 generates an AC excitation current $I_E$ and supplies the AC excitation current $I_E$ to the shunt resistor 12 and the reference resistor 12a. The AC excitation circuit 16 of the current excitation circuit 52 may be a switching power supply circuit to which the modulation signal $S_M$ is provided. The modulation signal $S_M$ is a signal having a relatively low frequency $f_M$, and is, for example, a square wave signal of about several hundred Hz. Although not shown here, the switching power supply circuit includes an inductor, a capacitor, and a switching element, and generates an AC excitation current $I_E$ by turning on and off the switching element in response to a modulation signal $S_M$ provided from the control circuit 10.

The first voltage measurement circuit 13 and the second voltage measurement circuit 13a are capable of measuring the voltage applied to the shunt resistor 12. A multiplexer 19 is connected between the voltage measurement circuits 13, 13a and each of the shunt resistor 12 and the reference resistor 12a.

The multiplexer 19 connects either the shunt resistor 12 and the voltage measurement circuit 13, 13a, or the reference resistor 12a and the voltage measurement circuit 13, 13a, depending on the control signal from the control circuit 10.

This allows the first voltage measurement circuit 13 and the second voltage measurement circuit 13a to measure the voltage across the reference resistor 12a and the voltage across the shunt resistor 12, respectively. The first voltage measurement circuit 13 includes an analog-to-digital (AD) converter 18, which converts the input voltage into a digital signal and outputs the digital signal to the signal processing circuit 14. The second voltage measurement circuit 13a also includes an AD converter 18a and converts the voltage into a digital signal and outputs the digital signal to the signal processing circuit 14.

As illustrated in FIG. 2, the signal processing circuit 14 includes the DSP 51 having a volatile memory and a non-volatile memory. The signal processing circuit 14 executes signal processing based on the measurement results of the voltage measurement circuits 13 and 13a. The signal processing circuit 14 operates in either a load current redundant detection mode or a shunt resistance measurement mode.

Load Current Redundant Detection Mode

In the load current redundancy detection mode, the signal processing circuit 14 detects the redundant load current $I_L$ flowing through the load 80 by measuring the voltage across the shunt resistor 12 using two voltage measurement circuits 13, 13a, while the AC excitation current $I_E$ from the current excitation circuit 52 does not flow through the reference resistor 12a and the shunt resistor 12, and while it flows through the shunt resistor 12 from the load 80.

Specifically, the control circuit 10 switches the input and output of the multiplexer 19 to measure the voltage across the shunt resistor 12 using the first voltage measurement circuit 13, and also measures the voltage across the shunt resistor 12 using the second voltage measurement circuit 13a. Therefore, it is possible to detect the voltage across the shunt resistor 12 simultaneously by the first voltage measurement circuit 13 and the second voltage measurement circuit 13a. As a result, the load current $I_L$ can be detected redundantly. Furthermore, even if one of the voltage measurement circuits 13 were to malfunction, the other voltage measurement circuit 13a can compensate for it by measuring the voltage and maintaining the functionality of load current $I_L$ measurement.

Shunt Resistance Measurement Mode

In the shunt resistance measurement mode, the current excitation circuit 52 causes an AC excitation current $I_E$ to flow through the reference resistor 12a and the shunt resistor 12. In this state, the signal processing circuit 14 detects the resistance value $R_S$ of the shunt resistor 12 based on the voltage across the reference resistor 12a and the voltage across the shunt resistor 12 measured by the first voltage measurement circuit 13 and the second voltage measurement circuit 13a, respectively.

In the shunt resistor measurement mode, the control circuit 10 switches the output of the multiplexer 19 to the side of the first voltage measurement circuit 13, and measures the resistance value $R_S$ of the shunt resistor 12 using the first voltage measurement circuit 13 for the purpose of measuring the load current $I_L$. In addition, the control circuit 10 switches the output of the multiplexer 19 to the side of the second voltage measurement circuit 13a, and measures the resistance value $R_S$ of the shunt resistor 12 using the redundant second voltage measurement circuit 13a provided for functional safety purposes. Therefore, by utilizing the two voltage measurement circuits 13 and 13a provided for functional safety purposes, it is possible to configure the system without the need to add any additional voltage measurement circuits. As a result, it can be constructed with lower cost.

In the shunt resistance measurement mode, the AC excitation current $I_E$ and the load current $I_L$ flow through the shunt resistor 12. At this time, the voltage applied to the shunt resistor 12 can be calculated by multiplying the resistance value $R_S$ and a sum of the AC excitation current $I_E$ and the load current $I_L$. In other words, the voltage across the shunt resistor $12 = R_S \times (I_E + I_L)$. Information on the reference AC excitation current $I_E$ is stored in advance in the memory.

The signal processing circuit 14 is able to measure only the load current $I_L$ based on subtracting the reference alternating excitation current $I_E$, which is a predetermined value stored in the memory, from the monitored alternating excitation current $I_E$ using the reference resistor $R_{REF}$. As a result, the load current $I_L$ can be measured with higher accuracy. Furthermore, the signal processing circuit 14 can monitor the load current $I_L$ in either the load current redundant detection mode or the shunt resistance measurement mode. This allows for continuous monitoring of the abnormality of the load current $I_L$.

An example of the signal processing circuit 14 will be described with reference to FIG. 3. As shown in FIG. 3, the signal processing circuit 14 includes an AC measurement path 14b and a DC measurement path 14c. The AC measurement path 14b includes a synchronous demodulation circuit 14a for synchronous demodulation of the respective measurement results of the first voltage measurement circuit 13 and the second voltage measurement circuits 13a. The DC measurement path 14c measures the DC component from the measurement results of the first voltage measurement circuit 13 and the second voltage measurement circuit 13$a$. The synchronous demodulation circuit 14$a$ may also be referred to as a synchronous detection circuit.

Regarding AC Measurement Path 14$b$

The signal processing circuit 14 executes the signal processing in the AC measurement path 14$b$, based on the voltage measured by the first voltage measurement circuit 13 and measures the resistance value $R_S$ of the shunt resistor 12. The AC measurement path 14$b$ includes the synchronous demodulation circuit 14$a$, a divider 43$a$, and a multiplier 44$a$. In the shunt resistance measurement mode, the signal processing circuit 14 executes synchronous demodulation of the measurement results of the first voltage measurement circuit 13 and the second voltage measurement circuit 13$a$ through the synchronous demodulation circuit 14$a$ of the AC measurement path 14$b$ to detect the AC component of the AC excitation current $I_E$.

For example, the signal processing circuit 14 executes the signal processing at the same frequency as the output frequency of the digital output of the AD converter 18 included in the first voltage measurement circuit 13, for the synchronous demodulation at a frequency same as the frequency of the AC excitation current $I_E$ induced by the modulation signal $S_M$. Therefore, the synchronous demodulation circuit 14$a$ can accurately measure the voltage applied to the shunt resistor 12 by the AC excitation current $I_E$.

The synchronous demodulation circuit 14$a$ includes mixers 21$i$, 21$q$, 22$i$, and 22$q$, filters 31$i$, 31$q$, 32$i$, and 32$q$, and absolute value calculators 41 and 42. The signal processing circuit 14 processes signals in synchronization with the output frequency of the digital output of the AD converter 18 of the first voltage measurement circuit 13 and the AD converter 18$a$ of the second voltage measurement circuit 13$a$, and performs synchronous demodulation at the same frequency as the frequency of the AC excitation current $I_E$.

When the mixers 21$i$ and 21$q$ receive the measurement voltage from the first voltage measurement circuit 13, The mixers 21$i$ and 21$q$ mix (multiply) the measurement voltages with each other to generate voltage signals with a phase difference of 90° as the sample synchronous signals from the first voltage measurement circuit 13, and output the generated voltage signals to filters 31$i$ and 31$q$, respectively. The filters 31$i$ and 31$q$ are low-pass filters that restrict the bandwidth of the respective input voltage data, and output the voltage that has passed through the low-frequency range to the absolute value calculator 41.

The output voltages of filters 31$i$ and 31$q$ represent the real component Re and imaginary component Im, respectively. The absolute value calculator 41 calculates the square root of the sum of squares of the real component Re and imaginary component Im, and outputs the calculated result as the output of the synchronous demodulation circuit 14$a$. This result is output to the divider 43. The synchronous demodulation circuit 14$a$ outputs the measurement result of the shunt resistor 12. The measurement result is calculated as the product of the AC excitation current $I_E$ and the resistance value $R_S$ of the shunt resistor 12 ($I_E \times R_S$), to the divider 43$a$.

When the mixers 22$i$ and 22$q$ receive the measurement voltage from the second voltage measurement circuit 13$a$, the mixers 22$i$ and 22$q$ mix (multiply) the measurement voltages with each other to generate voltage signals with a phase difference of 90° as the sample synchronous signals from the second voltage measurement circuit 13$a$, and output the generated voltage signals to filters 32$i$ and 32$q$, respectively. The filters 32$i$ and 32$q$ are low-pass filters that restrict the bandwidth of the respective input voltage data, and output the voltage that has passed through the low-frequency range to the absolute value calculator 42.

The output voltages of filters 32$i$ and 32$q$ represent the real component Re and imaginary component Im, respectively. The absolute value calculator 42 calculates the square root of the sum of squares of the real component Re and imaginary component Im, and outputs the calculated result as the output of the synchronous demodulation circuit 14$a$. This result is output to the divider 43$a$. As a result, the synchronous demodulation circuit 14$a$ will output the calculated measurement result $I_E \times R_{REF}$, which is the product of the AC excitation current $I_E$ and the resistance value $R_{REF}$ of the reference resistor 12$a$, to the divider 43$a$.

The signal processing circuit 14 performs calculations using the divider 43$a$ and multiplier 44$a$ based on the two output results of the synchronous demodulation circuit 14$a$. The signal processing circuit 14 measures the resistance value $R_S$ of the shunt resistor 12 by dividing the measurement result $I_E \times R_S$ of the shunt resistor 12 by the measurement result $I_E \times R_{REF}$ of the reference resistor 12$a$ using the divider 43, and then multiplying the obtained quotient by the reference resistance value $R_{REF}$ of the reference resistor 12$a$, which is pre-stored value, using the multiplier 44.

The reference resistance value $R_{REF}$ of the reference resistor 12$a$ is measured preliminarily during manufacture or inspection of the reference resistor 12$a$, and is stored preliminarily in a non-volatile memory (not shown) of the signal processing circuit 14. Therefore, the signal processing circuit 14 can eliminate the influence of the AC excitation current $I_E$ by executing the above-mentioned predetermined calculation using the divider 43$a$ and the multiplier 44$a$.

Therefore, even if there are noises other than the main component in the AC excitation current $I_E$, such as the load current $I_L$ or external noise that contains DC component noise, or if there are low-frequency noises (1/f noise, offset, etc.) in the first voltage measurement circuit 13 and the second voltage measurement circuit 13$a$, their influence can be eliminated. As a result, the resistance value $R_S$ of the shunt resistor 12 can be measured with higher accuracy.

The features of the synchronous demodulation circuit 14$a$ can be summarized as follows. The signal processing circuit 14 detects a component obtained by dividing the resistance value Rs of the shunt resistor 12 by the resistance value $R_{REF}$ of the reference resistor 12$a$, and multiplies the detected component by the reference resistance value $R_{REF}$ of the reference resistor 12$a$ previously recorded in the signal processing circuit 14, in order to calculate the resistance value $R_S$ of the shunt resistor 12. By synchronously demodulating, this enables the detection of only the main component of the AC excitation current IE at a specific frequency, even when the load current IL or external noise contains DC component noise. As a result, noise can be eliminated, and the resistance value $R_S$ of the shunt resistor 12 can be detected with higher accuracy.

Furthermore, even if the AC excitation current $I_E$ contains noise within the specific frequency range used for extracting it through synchronous demodulation, the signal processing circuit 14 accurately detects the resistance value $R_S$ of the shunt resistor 12 by dividing the output of the first voltage measurement circuit 13 by the output of the second voltage measurement circuit 13$a$.

Regarding DC Measurement Path 14$c$

On the other hand, the DC measurement path 14$c$ of the signal processing circuit 14 is equipped with a low-pass filter 45 to restrict the bandwidth of the measurement signal of the first voltage measurement circuit 13, and a low-pass filter 46 to restrict the bandwidth of the measurement signal of the second voltage measurement circuit 13a. After the low-pass filter 45, there is an adder/subtractor 47 that adds or subtracts an offset, and a multiplier 49 that adjusts the gain of the output of the adder/subtractor 47. After the low-pass filter 46, there is an adder/subtractor 48 that adds or subtracts an offset, and the multiplier 49 that adjusts the gain of the output of the adder/subtractor 48.

In the load current redundant detection mode, the signal processing circuit 14 detects the load current $I_L$ from a signal obtained through the low-pass filters 45 and 46. The cutoff frequencies of the low-pass filters 45 and 46 are set so as to cut off the frequency components of the AC excitation current $I_E$. The low-pass filter 45 passes the low frequency components of the voltage measured by the first voltage measurement circuit 13 and cuts out high frequency noise exceeding the DC component. The low-pass filter 46 passes the low frequency components of the voltage measured by the second voltage measurement circuit 13a and cuts out high frequency noise exceeding the DC component. Since the load current $I_L$ is a component that is generally closer to a direct current, the main component of the load current $I_L$ can be obtained.

The adders/subtractors 47, 48 add or subtract the offset in order to minimize the influence of low-frequency noise (1/f noise, offset) of the first voltage measurement circuit 13 and the second voltage measurement circuit 13a. As a result, it is possible to remove the influence of the excitation component including the AC excitation current $I_E$ and eliminate the noise component to enable accurate measurement of the DC component of the load current $I_L$.

Second Embodiment

The following describes a second embodiment with reference to FIGS. 4 to 8. A shunt-based current sensor 201 shown in FIG. 4 includes a first reference resistor 12a and a second reference resistor 12b instead of the reference resistor 12a described in the first embodiment. The first reference resistor 12a and the second reference resistor 12b are connected in series to the shunt resistor 12. The material of the first reference resistor 12a and the second reference resistor 12b may be made of tantalum nitride, titanium nitride, or nitride. The first reference resistor 12a determines the resistance value $R_{REF1}$ by measuring a high-precision current externally applied during the pre-shipment inspection of the shunt-based current sensor 201, and preliminarily store the determined value as the reference resistance value $R_{REF1}$ in the memory of the signal processing circuit 14.

With regard to the relationship among the resistance value $RR_{REF1}$ of the first reference resistor 12a, the resistance value $R_{REF2}$ of the second reference resistor 12b, and the resistance value RS of the shunt resistor 12, they are set to satisfy a condition of $R_{REF1} >> R_{REF2} >> R_S$. In other words, $R_{REF1}$ is much greater than $R_{REF2}$, and $R_{REF2}$ is much greater than $R_S$. The relationship between the resistance value $R_{REF1}$ and the resistance value $R_{REF2}$, and the relationship between the resistance value $R_{REF2}$ and the resistance value $R_S$ may be set to a difference of one to two digits, or two to three digits, for example, about 10:1 to 100:1, or about 100:1 to 1000:1. The resistance value $R_S$ of the shunt resistor 12 is measured by taking the ratio of the shunt resistor 12 to the first reference resistor 12a. For this reason, it would be easier to make measurements if similar resistance values were selected. However, generally available high-precision, low-degradation reference resistor 12a has a resistance value of 10 ohms or higher. Therefore, the first reference resistor 12a and the shunt resistor 12 are constructed using resistors with significantly different resistance values, $R_{REF1}$ and $R_S$, respectively. Furthermore, the resistance value $R_{REF1}$ of the first reference resistor 12a is designed to have less long-term drift compared to the resistance value $R_{REF2}$ of the second reference resistor 12b and the resistance value $R_S$ of the shunt resistor 12.

The shunt-based current sensor 201 includes a current excitation circuit 252 instead of the current excitation circuit 52 described in the previous embodiment. The current excitation circuit 252 includes AC excitation circuits 16 and 16a that output the first AC excitation current $I_{E1}$ and the second AC excitation current $I_E$, respectively. The respective frequencies of the first AC excitation current $I_{E1}$ and the second AC excitation current $I_E$ are set to be the same. The second AC excitation current $I_E$ is a current similar to the AC excitation current $I_E$ shown in the first embodiment, and is generated by a switching power supply circuit. On the other hand, the AC excitation circuit 16a may include a linear regulator (LDO). The first AC excitation current $I_{E1}$ may be generated by toggling the switching element using a modulation signal of several hundred Hz provided from the control circuit 10.

Method of Measuring the Resistance Value $R_S$ of the Shunt Resistor 12 in the Shunt Resistance Measurement Mode In the shunt resistance measurement mode, the signal processing circuit 14 measures the resistance value $R_S$ of the shunt resistor 12 through a first measurement process and a second measurement process. In the first measurement process, the control circuit 10 applies the first AC excitation current $I_{E1}$ from the current excitation circuit 252 to the first reference resistor 12a and the second reference resistor 12b. Furthermore, the control circuit 10 detects the voltage across the first reference resistor 12a using the first voltage measurement circuit 13 by switching the input and output of the multiplexer 19. At the same time, the control circuit 10 detects the voltage across the second reference resistor 12b using the second voltage measurement circuit 13a. The first measurement process may be referred to as, for example, Step 1 in FIG. 7, and the second measurement process may be referred to as, for example, Step 2 in FIGS. 7 and 8.

In the second measurement process, the control circuit 10 applies the second AC excitation current $I_E$ to the second reference resistor 12b and the shunt resistor 12 from the current excitation circuit 252. Furthermore, the control circuit 10 detects the voltage across the second reference resistor 21b using the first voltage measurement circuit 13 by switching the input and output of the multiplexer 19. At the same time, the control circuit 10 detects the voltage across the shunt resistor 12 using the second voltage measurement circuit 13a.

The signal processing circuit 14, in the shunt resistor measurement mode, executes synchronous demodulation of the respective outputs of the first voltage measurement circuit 13 and the second voltage measurement circuit 13a. The signal processing circuit 14 extracts the main components of the first AC excitation current $I_{E1}$ and the second AC excitation current $I_E$ as voltages. The signal processing circuit 14 calculates the resistance ratio $R_S/R_{RREF2}$ by dividing the voltage across the shunt resistor 12, which has the resistance value $R_S$, by the voltage across the second reference resistor 12b, which has the resistance value $R_{RREF2}$, by using the divider 43a.

Additionally, the signal processing circuit 14 calculates the resistance ratio $R_{RREF2}/RR_{REF1}$ by dividing the voltage across the second reference resistor 12b, which has the resistance value $R_{RREF2}$, by the voltage across the first reference resistor 12a, which has the resistance value $RR_{REF1}$, by using the divider 43b. Furthermore, the signal processing circuit 14 calculates the resistance ratio $R_S/R_{RREF1}$ by multiplying the resistance ratio $R_S/R_{RREF2}$ and the resistance ratio $R_{RREF2}/R_{RREF1}$ by using the multiplier 44a. Additionally, the multiplier 44a multiplies the resistance ratio $R_S/R_{RREF1}$ by the reference resistance value $R_{RREF1}$ of the first reference resistor 12a, which is preliminarily stored in the memory. This allows for the measurement of the resistance value $R_S$ of the shunt resistor 12. As a result, the resistance value $R_S$ of the shunt resistor 12 can be measured with higher accuracy.

Method of Measuring Load Current $I_L$ in Load Current Redundant Detection Mode In the load current redundant detection mode, the signal processing circuit 14 measures the load current $I_L$ using the DC measurement path 14c. The DC measurement path 14c includes low-pass filters 45 and 46, as well as adders/subtractors 47 and 48. Thus, the signal processing circuit 14 can measure the load current $I_L$ by applying the low-pass filter 45 to the output of the first voltage measurement circuit 13 and the low-pass filter 46 to the output of the second voltage measurement circuit 13a.

Figure 5:
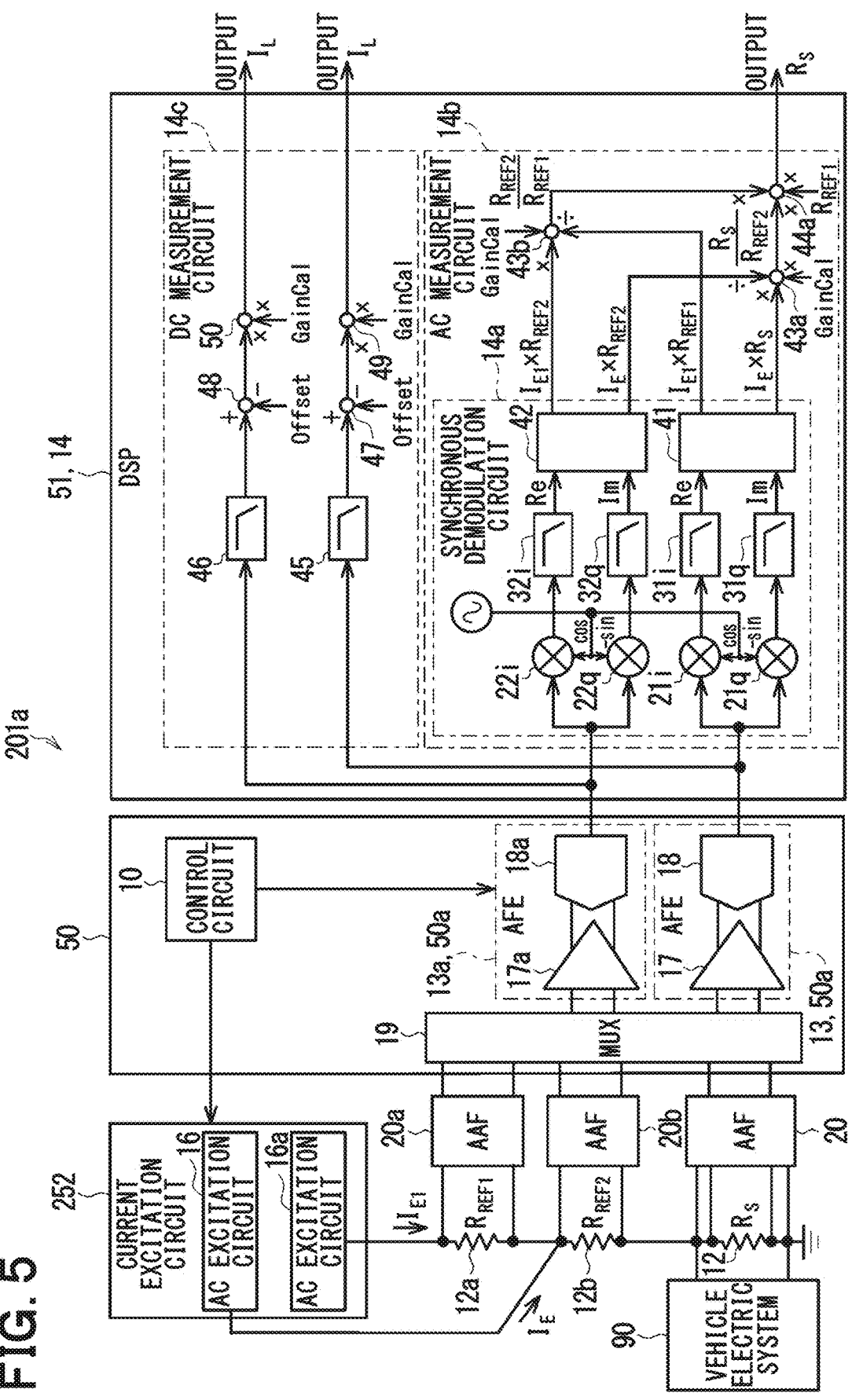
FIG. 5 is a first configuration example of the shunt-based current sensor according to the second embodiment.
Figure 6:
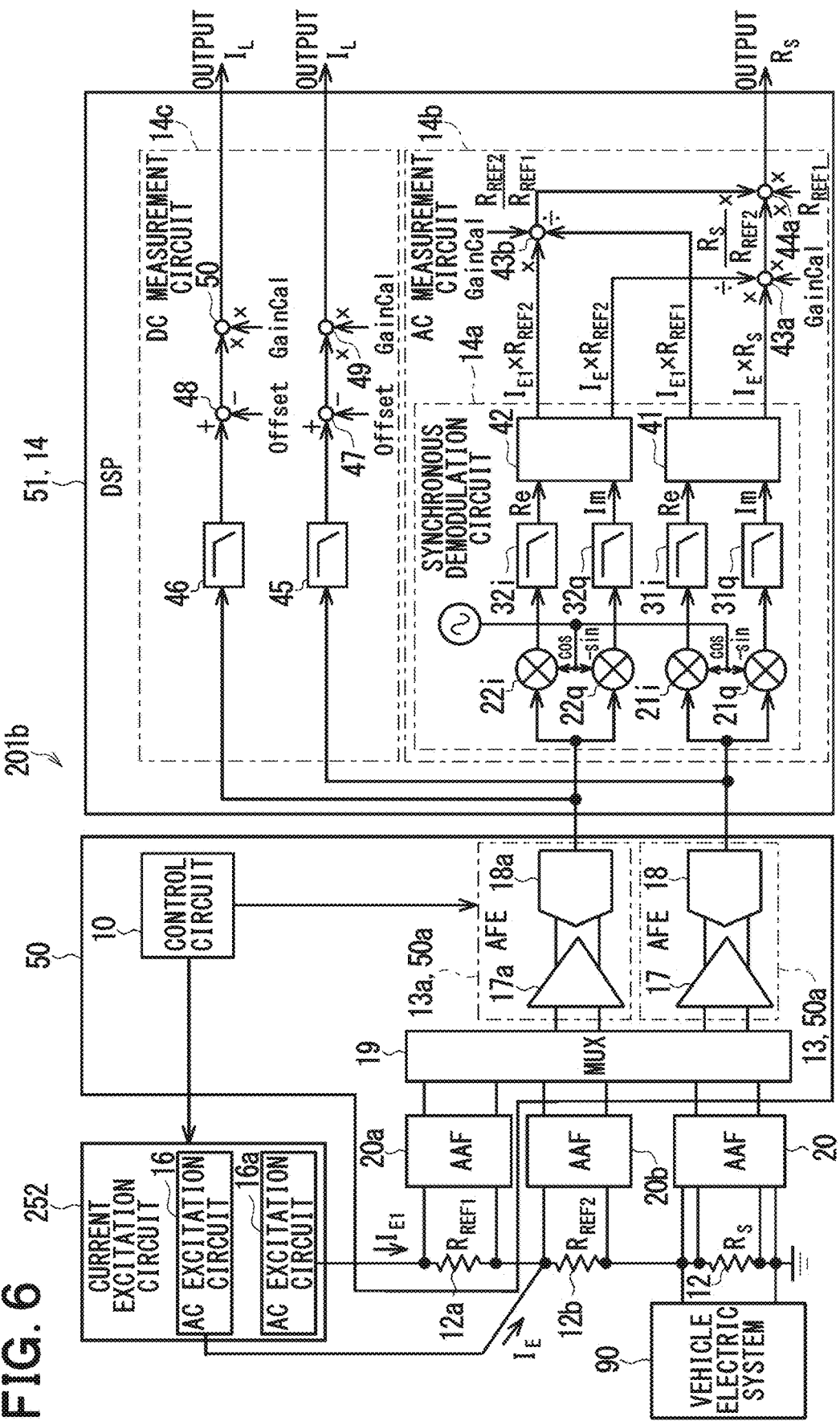
FIG. 6 is a second configuration example of the shunt-based current sensor according to the second embodiment.

The following describes a hardware configuration with reference to FIGS. 5 and 6. FIGS. 5 and 6 illustrate respective hardware configurations of the shunt resistance measurement circuits 201a, 201b according to the second embodiment. As illustrated in FIG. 5 or 6, blocks included in the shunt-based current sensor 401a, 401b may be divided into hardware such as the ASIC 50 as the integrated circuit, the DSP 51, and the current excitation circuit 52.

As illustrated in FIG. 5, the ASIC 50 includes the control circuit 10, the first voltage measurement circuit 13, the second voltage measurement circuit 13a, and the multiplexer 19. The first voltage measurement circuit 13 includes a differential switched capacitor amplifier 17 and an AD converter 18 including a delta-sigma ($\Delta\Sigma$) modulator in its subsequent stage. The first voltage measurement circuit 13 is included in the analog front end 50a. The second voltage measurement circuit 13a includes a differential switched capacitor amplifier 17a and the AD converter 18a including a $\Delta\Sigma$ modulator in its subsequent stage. The second voltage measurement circuit 13a is included in the analog front end 50a.

As illustrated in FIG. 5, the first reference resistor 12a, the second reference resistor 12b, and the anti-aliasing filters 20a, 20b, and 20 may be provided externally to the ASIC 50. However, as illustrated in FIG. 6, it may be desirable to dispose the first reference resistor 12a in the ASIC 50. The first reference resistor 12a may be adapted to the same ASIC 50 (corresponding to an integrated circuit) to which the first voltage measurement circuit 13 and the second voltage measurement circuit 13a are adapted. By adapting the first reference resistor 12a to the same ASIC 50 to which the first voltage measurement circuit 13 and the second voltage measurement circuit 13a are adapted, there is no need to provide an additional reference resistor. Thus, it is possible to construct the first reference resistor 12a with a smaller area.

The ASIC 50 illustrated in FIG. 6 also includes an anti-aliasing filter 20a. The anti-aliasing filter 20a is arranged between the first reference resistor 12a and the multiplexer 19, and cuts frequency components higher than the Nyquist frequency before the measurement voltage of the first reference resistor 12a is provided to the AD converters 18, 18a.

Outside the ASIC 50, anti-aliasing filters 20b and 20 are provided. The anti-aliasing filter 20b is arranged between the second reference resistor 12b and the multiplexer 19, and cuts frequency components higher than the Nyquist frequency before the measurement voltage of the second reference resistor 12b is provided to the AD converters 18, 18a. The anti-aliasing filter 20 is arranged between the shunt resistor 12 and the multiplexer 19, and cuts frequency components higher than the Nyquist frequency before the measurement voltage of the shunt resistor 12 is provided to the AD converters 18, 18a. In addition, in FIGS. 5 and 6, the same reference numerals are assigned to the identical parts as in FIG. 4, and the explanation of the identical parts is omitted.

Figure 7:
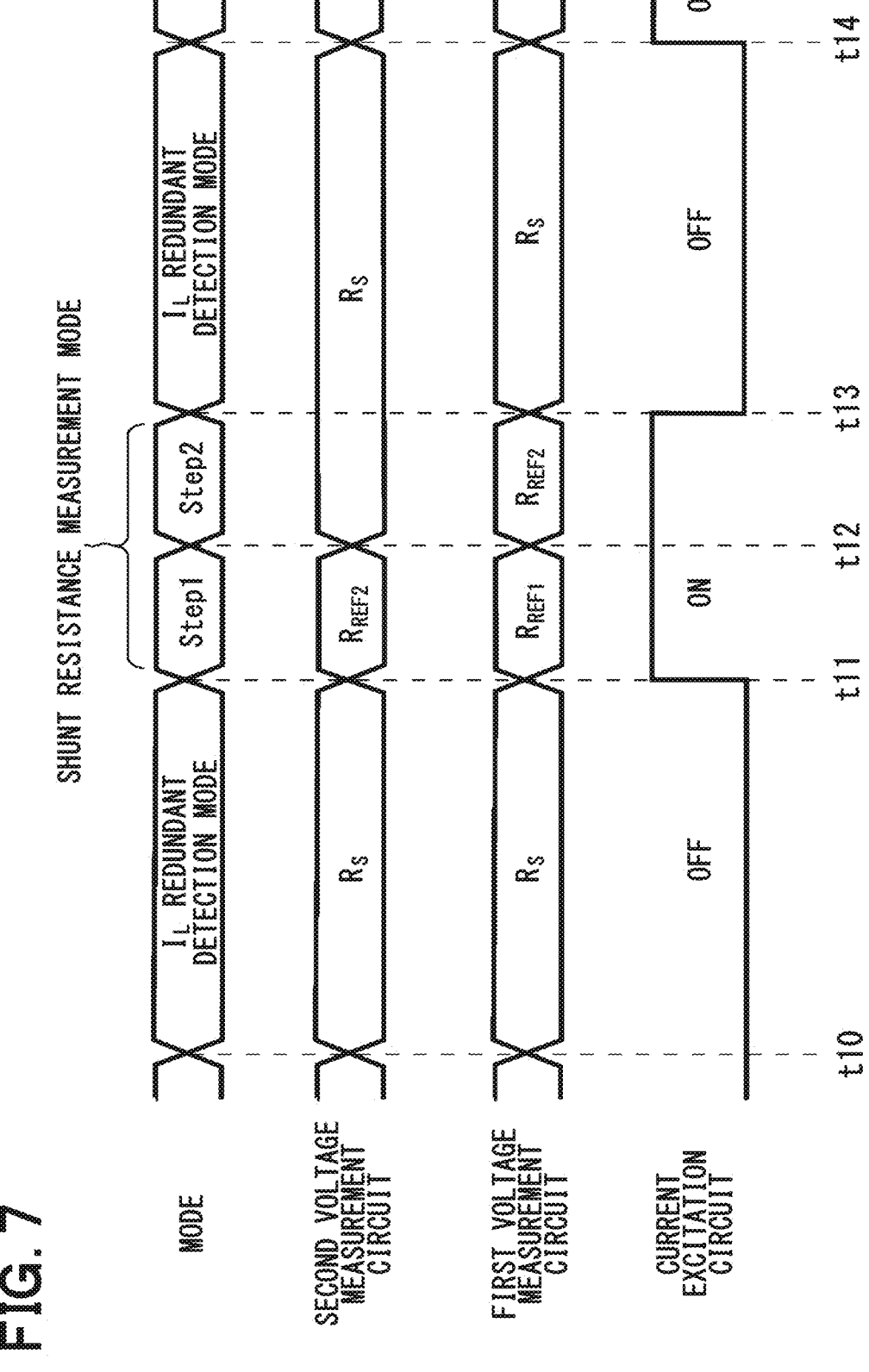
FIG. 7 is a first time chart illustrating the operation in the second embodiment.
Figure 8:
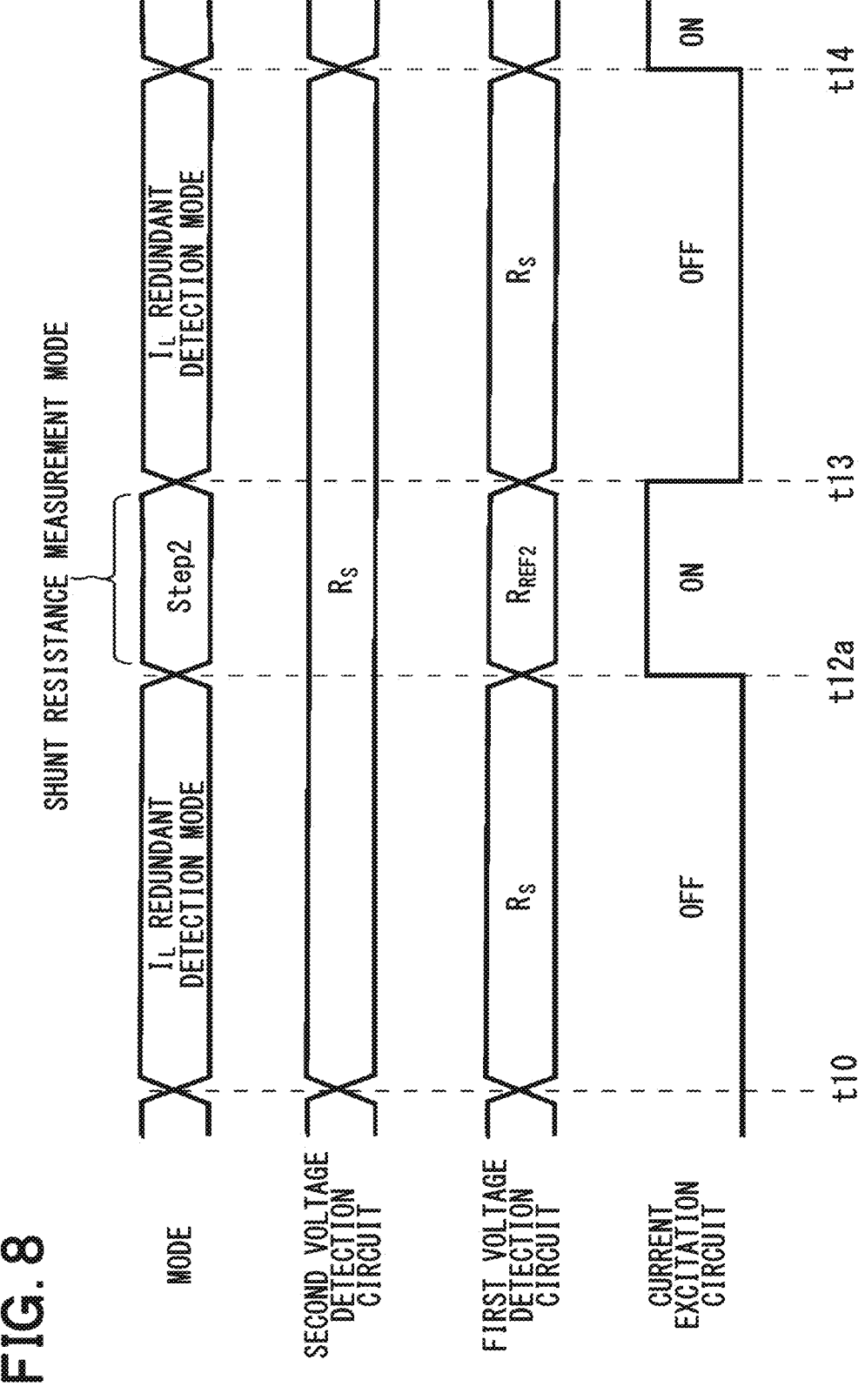
FIG. 8 is a second time chart illustrating the operation of the second embodiment.

The following describes the usage of each mode with reference to FIGS. 7 and 8.

Control During Predetermined Long Period

For example, regardless of whether the vehicle ignition switch has been operated once every week or several weeks, the first measurement process and the second measurement process in the shunt resistance measurement mode may be executed as shown in FIG. 7. This is because the resistance value $R_S$ of the shunt resistor 12 is measured using the resistance value $R_{REF1}$ of the first reference resistor 12a, which is relatively less affected by drift.

The following explanation in chronological order, in other words, time-series basis. During the period from timing t10 to t11 in FIG. 7, the control circuit 10 controls the current excitation circuit 52 to be turned off. The signal processing circuit 14 transitions to the load current redundancy detection mode and measures the voltage across the shunt resistor 12, which is the resistance value $R_S$, using the first voltage measurement circuit 13 and the second voltage measurement circuit 13a, and detects the redundant load current IL.

During the period from timing t11 to t12 in FIG. 7, the control circuit 10 controls the current excitation circuit 52 to be turned on. The signal processing circuit 14 transitions to the shunt resistor measurement mode and, in the first measurement process, measures the voltage across the second reference resistor 12b, which has the resistance value RREF2, using the second voltage measurement circuit 13a. Additionally, the signal processing circuit 14 measures the voltage across the first reference resistor 12a, which has the resistance value $R_{REF1}$, using the first voltage measurement circuit 13. This allows the signal processing circuit 14 to measure the resistance ratio $R_{REF2}/R_{REF1}$ through the AC measurement path 14b.

During the period from timing t12 to t13 in FIG. 7, the control circuit 10 controls the current excitation circuit 52 to be turned on. In the second measurement process of the shunt resistor measurement mode, the signal processing circuit 14 measures the voltage across the shunt resistor 12, which has the resistance value $R_S$, using the second voltage measurement circuit 13a. Additionally, the signal processing circuit 14 measures the voltage across the first reference resistor 12*a*, which has the resistance value $R_{REF1}$, using the first voltage measurement circuit 13. Therefore, it is possible that the signal processing circuit 14 measures the resistance ratio $R_S/R_{REF2}$ through the AC measurement path 14*b*. For this reason, the resistance value $R_S$ of the shunt resistor 12 can be measured by performing the above-mentioned measurement process.

During the period from timing t13 to timing t14 in FIG. 7, the control circuit 10 controls the operation of the current excitation circuit 52 to be turned off. The signal processing circuit 14 transitions to the load current redundancy detection mode and measures the voltage across the shunt resistor 12, which is the resistance value $R_S$, using the first voltage measurement circuit 13 and the second voltage measurement circuit 13*a*, and detects the redundant load current $I_L$. According to the flow of the time chart shown in FIG. 7, the second voltage measurement circuit 13*a* can monitor the voltage across the shunt resistor $R_S$ at a process other than the first measurement process.

Control During Specified Short Period

During a relatively short period, such as when the vehicle is starting up in response to the operation of the ignition switch, the signal processing circuit 14 may execute only the second measurement process in the shunt resistance measurement mode, as shown in FIG. 8.

That is, the signal processing circuit 14 may execute the second measurement process without executing the first measurement process adopted for calibration using the first reference resistor 12*a*. That is, when there is no need to perform calibration using the first reference resistor 12*a* which is less affected by drift, it is possible to omit the first measurement process and execute the process as shown at timings t10 to t12*a* and t12*a* to t13 in FIG. 8. Then, by using the results of the first measurement process that have been recorded in advance, i.e., the results of the resistance ratio $R_{REF2}/R_{REF1}$, it is possible to measure the resistance value $R_S$ of the shunt resistor 12 and perform fault diagnosis, thereby eliminating the processing time of the first measurement process.

By performing the process shown in FIG. 8, a fault diagnosis and deterioration correction for the resistance value $R_S$ of the shunt resistor 12 can be performed. According to the flow of the time chart shown in FIG. 8, the second voltage measurement circuit 13*a* constantly monitors the voltage across the shunt resistor $R_S$, making it unnecessary to use the multiplexer 19 for switching.

The Summary of Second Embodiment

According to the configuration of the present embodiment, the resistance value $R_S$ of the shunt resistor 12 is measured using the first voltage measurement circuit 13 and the second voltage measurement circuit 13*a* that are provided redundantly for functional safety purposes, so that the configuration can be made at lower cost.

When the signal processing circuit 14 performs resistance measurement mode signal processing, for example, during vehicle operation, there is a concern that the measurement accuracy of the shunt resistor 12 may be degraded due to the superimposition of the vehicle's load current $I_L$ and AC excitation current $I_E$. However, by using the synchronous demodulation circuit 14*a*, it is possible to separate and detect these signals, achieving high accuracy detection.

The signal processing circuit 14 detects the AC excitation component from the synchronous demodulation circuit 14*a*, and extracts the DC excitation component through the low-pass filters 45 and 46. As a result, the signal processing circuit 14 can detect the load current $I_L$ based on the DC excitation component, while also detecting the resistance value $R_S$ of the shunt resistor 12 based on the AC excitation component. Thus, it is possible to simultaneously detect the resistance value $R_S$ of the shunt resistor 12 and the load current $I_L$.

According to the configuration shown in FIG. 6, by using the built-in first reference resistor 12*a* in an integrated circuit, which requires a high-precision reference resistor 12*a*, it is possible to achieve low-cost detection and eliminate the need for a high-precision reference power supply. In the present embodiment, the resistance value $R_S$ of the shunt resistor 12 is measured by taking the ratio of the shunt resistor 12*a* to the reference resistor 12*b* and the ratio of the shunt resistor 12 to the reference resistor 12*b*. For this reason, it would be easier to make measurements if similar resistance values were selected. However, generally available high-precision, low-degradation first reference resistor 12*a* has a resistance value of 10 ohms or higher. Therefore, the reference resistor 12*a* and the shunt resistor 12 are constructed using resistors with significantly different resistance values, $R_{REF1}$ and $R_S$, respectively. If the resistance ratio becomes too small, the signal entering the voltage measurement circuit decreases, resulting in a poor signal-to-noise ratio and a degradation in resistance measurement accuracy. Therefore, in order to increase the resistance value ratio, a resistance of several tens of milliohms, which is a moderate value between the shunt resistor 12 with a resistance of several tens of microohms and the reference resistor 12*a* with a resistance of 10 ohms or more, is selected for the second reference resistor 12*b*. In the shunt resistor measurement mode, by dividing the measurement processes into two stages, it is possible to expand the dynamic range compared to a single-stage measurement. By switching the multiplexer 19, the first voltage measurement circuit 13 and the second voltage measurement circuit 13*a* for redundant detection may accommodate the two-step resistance measurement without the need to add additional voltage measurement circuits.

In the shunt resistor measurement mode, the signal processing circuit 14 executes synchronous demodulation of the outputs of the two voltage measurement circuits 13 and 13*a* using the synchronous demodulation circuit 14*a*. The signal processing circuit 14 extracts the main components of the first AC excitation current $I_{E1}$ and the second AC excitation current $I_E$, divides the resistance value $R_S$ of the shunt resistor 12 by the resistance value $R_{REF2}$ of the second reference resistor 12*b*, divides the resistance value $R_{REF2}$ of the second reference resistor 12*b* by the resistance value $R_{REF1}$ of the first reference resistor 12*a*, and multiplies these division results together with the preliminarily stored reference resistance value $R_{REF1}$ of the first reference resistor 12*a* to calculate the resistance value $R_S$ of the shunt resistor 12.

With this configuration, even if the first AC excitation current $I_{E1}$ and the second AC excitation current $I_E$ contained noise in a specific frequency band extracted by the synchronous demodulation circuit 14*a*, the influence of the noise can be eliminated. This is because the output of one of the first voltage measurement circuit 13 and the second voltage measurement circuit 13*a* is divided by the other output using dividers 43*a* and 43*b*, thereby excluding the influence of noise. As a result, it is possible to accurately determine the resistance ratios $R_S/R_{REF2}$ and $R_{REF2}/R_{REF1}$, and by multiplying these resistance ratios using multiplier 44a, the resistance value $R_S$ of the shunt resistor 12 can be calculated with high accuracy.

In the shunt resistor measurement mode, the signal processing circuit 14 calculates the load current $I_L$ by applying the low-pass filter 45 to the output of the first voltage measurement circuit 13, which measures the shunt resistor 12. This allows for the removal of the measurement voltage of the AC excitation current $I_E$ as a noise component, enabling the accurate measurement of the load current $I_L$. In addition, in the shunt resistor measurement mode, simultaneous detection of the load current $I_L$ can be achieved along with the resistance value $R_S$ of the shunt resistor 12 by using both the AC measurement path 14b and the DC measurement path 14c.

Furthermore, the resistance value $R_{REF1}$ of the first reference resistor 12a is designed to have less long-term drift compared to the resistance value $R_{REF2}$ of the second reference resistor 12b and the resistance value $R_S$ of the shunt resistor 12. The first reference resistor 12a, which has a small long-term drift value, is expensive. By using only an expensive reference resistor as the first reference resistor 12a, and by correcting the resistance value $R_{REF2}$ of the second reference resistor 12b and the resistance value $R_S$ of the shunt resistor 12 in the first measurement process and the second measurement process, respectively, it is possible to measure the resistance value $R_S$ of the shunt resistor 12 with lower cost and higher accuracy.

Third Embodiment

Figure 9:
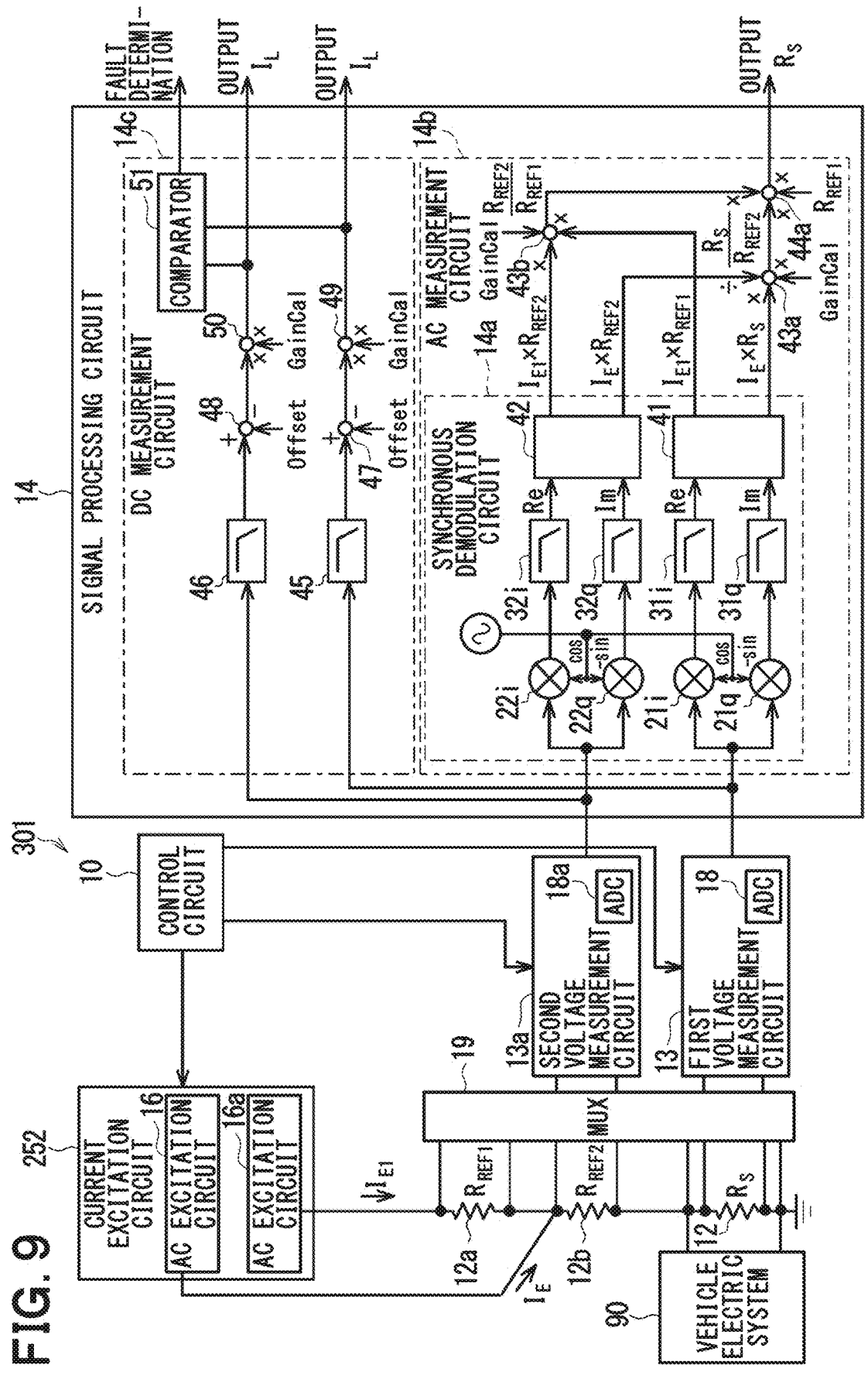
FIG. 9 is an electrical configuration diagram illustrating a shunt-based current sensor according to a third embodiment.

The following describes a third embodiment with reference to FIG. 9. Hereinafter, description of the same parts as those of the second embodiment will be omitted, and different parts will be described. A shunt-based current sensor 301 according to FIG. 9 includes a comparator 51 that compares measurement values measured by two voltage measurement circuits 13, 13a, respectively. As described in the above embodiment, the signal processing circuit 14 can redundantly detect the load current $I_L$ in the load current redundant detection mode. According to the present embodiment, the comparator 51 compares the two load current $I_L$ values, and if the load current $I_L$ exceeds an arbitrary abnormal value, a fault is detected and output. At this time, if one or more of the load current $I_L$ values exceed the arbitrary abnormal value, the signal processing circuit 14 may output a signal indicating detection of a fault in the DC measurement path 14c, the first voltage measurement circuit 13, or the second voltage measurement circuit 13a.

According to the present embodiment, in the DC measurement path 14c from the circuit that measures the voltage across the shunt resistor 12 to the calculation of the load current $I_L$, two paths are used to perform completely redundant detection of the load current $I_L$. Therefore, the functional safety requirements can be met by comparing these measured values using comparator 51 to detect a fault.

Fourth Embodiment

Figure 10:
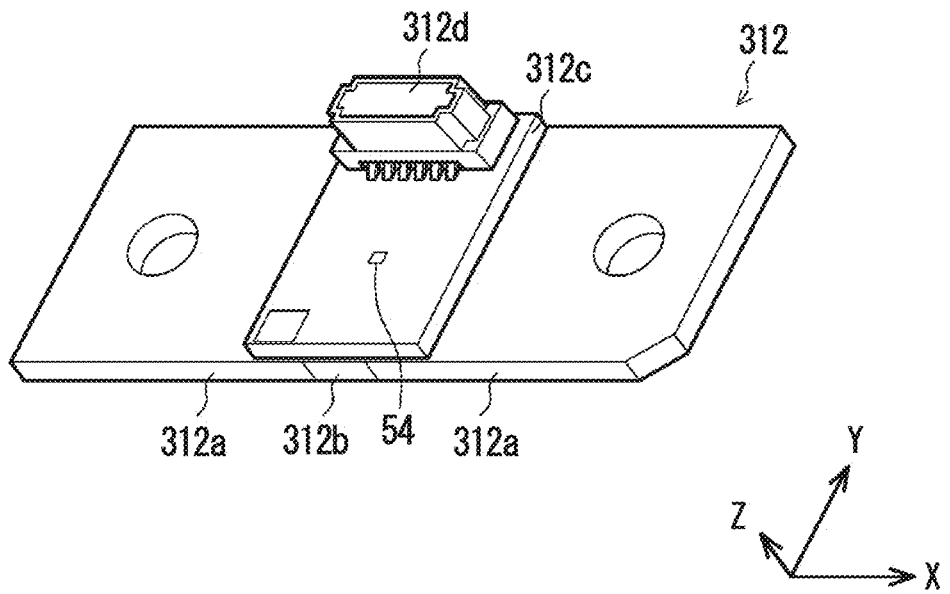
FIG. 10 is a perspective view showing a schematic external appearance of a shunt resistor according to a fourth embodiment.
Figure 11:
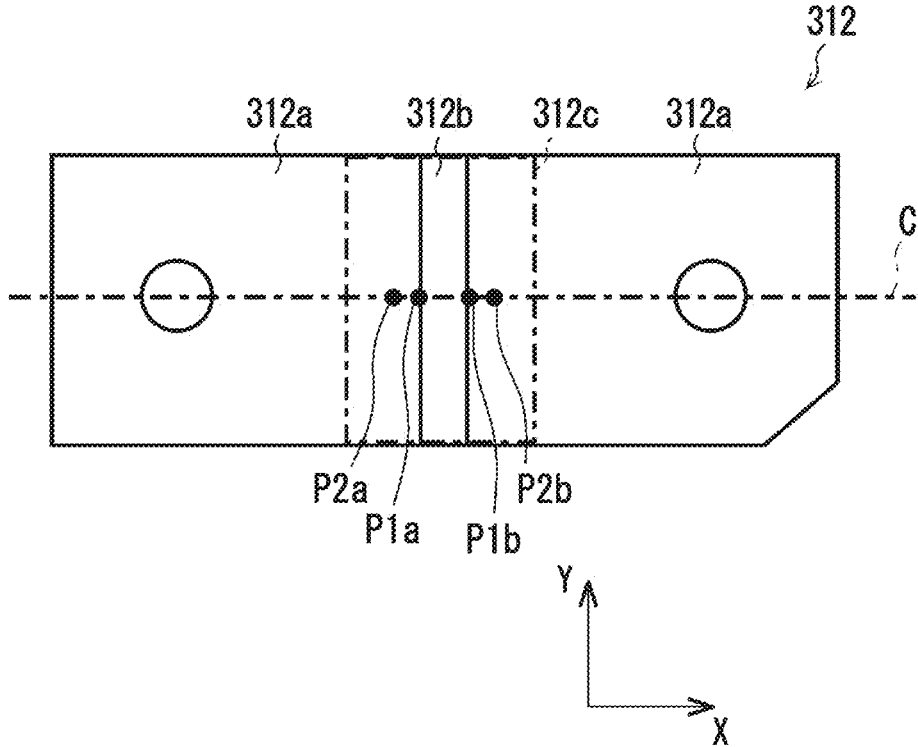
FIG. 11 is a plan view showing a schematic external appearance of the shunt resistor according to the fourth embodiment.

The following describes a fourth embodiment with reference to FIGS. 10 and 11. In the fourth embodiment, a structure of a shunt resistor 312 in replacement of the shunt resistor 12 will be described. Hereinafter, the same components as those of the above-mentioned embodiments such as first embodiment are denoted by the same reference numerals, and descriptions of the same components will be omitted, and different portions will be described. The shunt resistor 312 may be made of an alloy such as an alloy containing copper, manganese, or nickel having a resistance value $R_S$ with minimal temperature dependency.

As shown in FIGS. 10 and 11, the shunt resistor 312 is made of a copper material 312a and an alloy 312b. The shunt resistor 312 is extended in the X direction being the longitudinal direction, and is made of copper material 312a with an alloy 312b sandwiched in the middle part in the X direction.

As shown in FIG. 10, a printed circuit board 312c is fixed on the upper surfaces of the divided copper material 312a and alloy 312b. On the printed circuit board 312c, printed wiring that connects the shunt resistor 12 with the first voltage measurement circuit 13 and the second voltage measurement circuit 13a is formed. Additionally, the temperature sensor 54 is mounted at the center of the printed circuit board 312c in the XY plane direction, allowing the temperature of the shunt resistor 312 to be measured by the temperature sensor 54. A connector 312d is soldered onto the upper surface of the printed circuit board 312c, and the printed circuit board 312c is connected to the voltage measurement circuits 13 and 13a through the connector 312d and the multiplexer 19.

The connection points between the printed circuit board 312c and the shunt resistor 12 are provided at locations corresponding to the measurement points of the voltage measurement circuits 13 and 13a, which measure the voltage applied to the shunt resistor 12. As shown in FIG. 11, two sets of differential input points P1a-P1b and P2a-P2b are provided as the measurement points for the voltage measurement circuits 13 and 13a.

The first set of differential input points P1a-P1b is located at the boundary where the alloy 312b is sandwiched between the copper material 312a, while the second set of differential input points P2a-P2b is located further outward in the longitudinal X direction from the first set of differential input points P1a-P1b. The longitudinal X direction may also be referred to as a lengthwise X direction.

In this case, in the load current redundancy detection mode, it is possible to connect the differential input points P2a-P2b, which are used for the redundant detection of the voltage across the shunt resistor 12, to the outside of the differential input points P1a-P1b of the primary detection path. In the load current redundancy detection mode, using the differential input points P2a-P2b as the measurement points may introduce an error corresponding to the resistance value of the copper material 312a. However, the redundant detection voltage only needs to be used for fault diagnosis. In this case, by placing the differential input points P2a-P2b outside the differential input points P1a-P1b, the configuration can be made practically tolerable such that the error in the measured voltage for fault diagnosis remains within the acceptable threshold.

In the shunt resistor measurement mode, the differential input points P1a-P1b may be used for detection by the voltage measurement circuit 13 and to apply an AC excitation current $I_E$ to the differential input points P2a-P2b. By setting the detection points and application points in this manner, the common impedance of excitation and detection can be limited to only the resistance value $R_S$ of the shunt resistor 12. As a result, the resistance value $R_S$ of the shunt resistor 12 can be measured with higher accuracy. Therefore, an additional path for excitation is not required, resulting in a low-cost configuration.

Fifth Embodiment

The following describes a fifth embodiment with reference to FIGS. 12 to 15. The shunt-based current sensor 501 shown in FIG. 12 includes the control circuit 10, the current excitation circuit 552, the voltage measurement circuit 13, the signal processing circuit 14, and a mixer 15. The shunt-based current sensor 501 is connected to the shunt resistor 12. The control circuit 10 outputs the AC carrier signal $S_C$ and the AC modulation signal $S_M$. When the shunt-based current sensor 501 measures the resistance value RS of the shunt resistor 12 in the shunt resistor measurement mode, the control circuit 10 outputs the AC carrier signal $S_C$ and the AC modulation signal $S_M$ to the switching power supply circuit 11 with the relay 59 (see FIG. 2) turned off.

Figure 13:
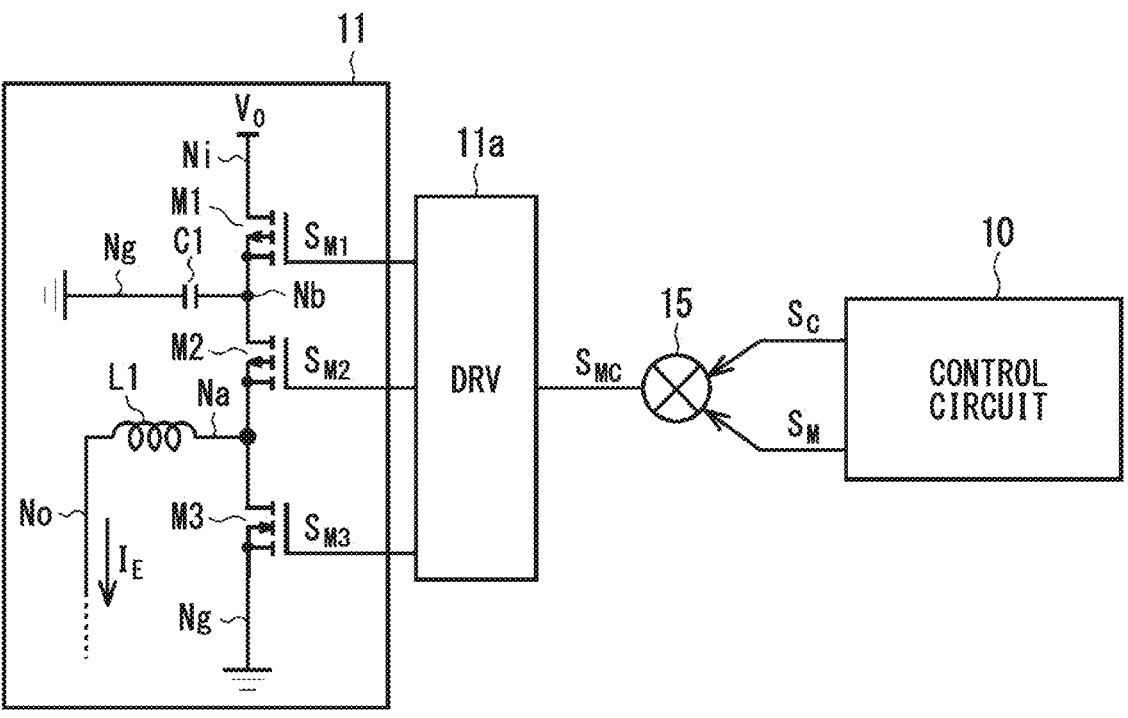
FIG. 13 is a configuration diagram of a switching power supply circuit according to the fifth embodiment.

The current excitation circuit 552 includes the AC excitation circuit 16a described in the above-mentioned embodiment. The current excitation circuit 552 also includes the switching power supply circuit 11. The switching power supply circuit 11 includes switching elements M1 to M3, as illustrated in FIG. 13. The switching power supply circuit 11 inputs a modulated carrier signal $S_{MC}$, obtained by multiplying the carrier signal $S_C$ and the modulation signal $S_M$ using the mixer 15, through the driver circuit 11a to drive the switching elements M1 to M3, and outputs power including the AC excitation current $I_E$ based on the modulated carrier signal $S_{MC}$.

Figure 12:
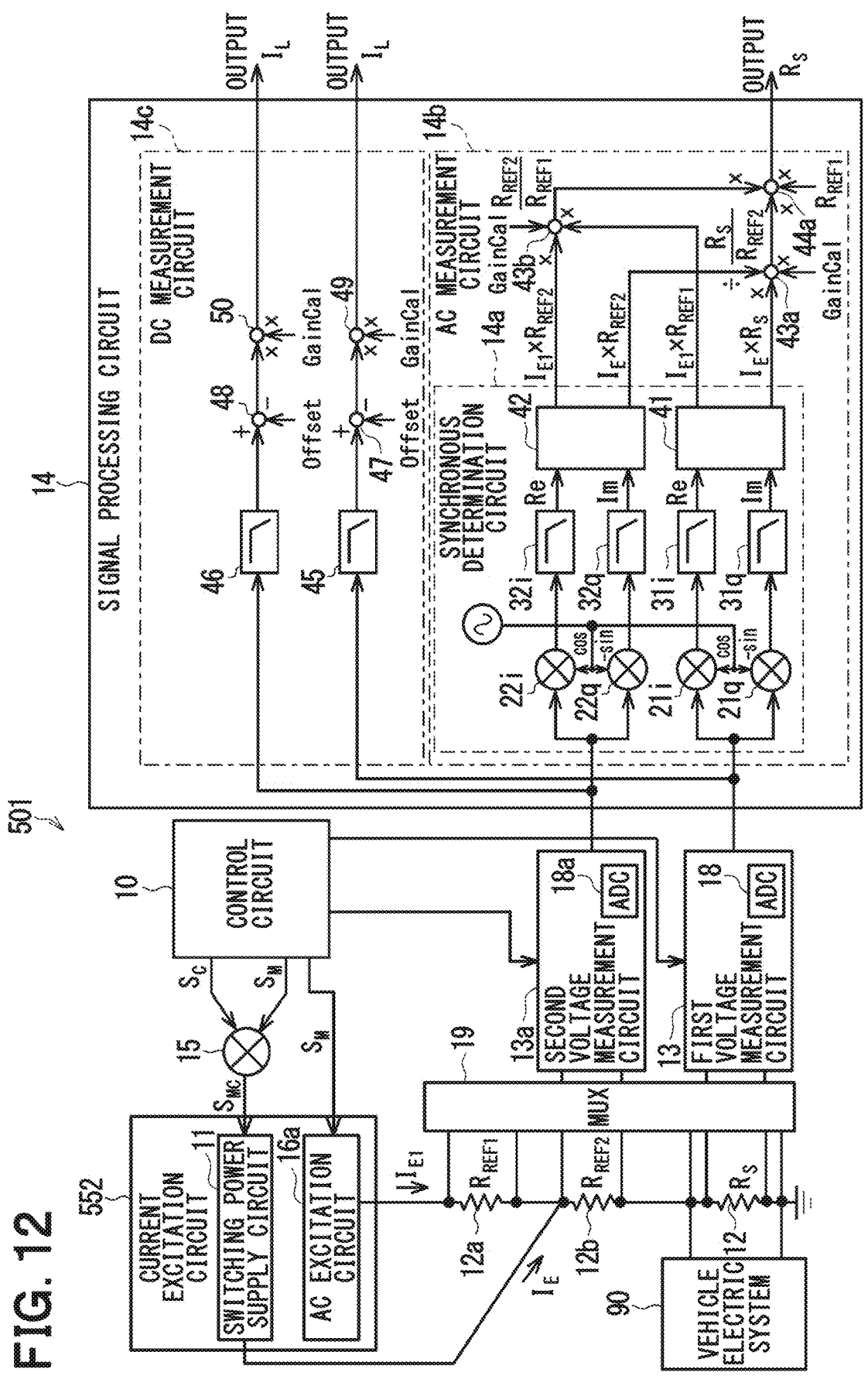
FIG. 12 is an electrical configuration diagram illustrating a shunt-based current sensor according to a fifth embodiment.

For practical purposes, as illustrated in FIG. 13, the driver circuit 11a is between the switching power supply circuit 11 and the mixer 15, but the driver circuit 11a is omitted from the drawings such as FIG. 12 which show the characteristic parts of the present disclosure in a block diagram.

The carrier signal $S_C$ is a square wave signal having a frequency $f_C$ of several ten KHz, for example, about 10 KHz. Hereinafter, the reciprocal of the frequency $f_C$ is represented as a period Tc. The modulation signal $S_M$ is a signal having a frequency $f_M$ lower than that of the carrier signal $S_C$, and is, for example, a square wave signal of about several hundred Hz. Hereinafter, the reciprocal of the frequency $f_M$ is represented as the period $T_M$. The mixer 15 multiplies the carrier signal $S_C$ and the modulated signal $S_M$ to generate a modulated carrier signal $S_{MC}$, and outputs the modulated carrier signal $S_{MC}$ to the switching power supply circuit 11.

The modulated carrier signal $S_{MC}$ is used as a signal for driving the switching power supply circuit 11. The modulated carrier signal $S_{MC}$ is a signal in which a relatively high frequency carrier signal $S_C$ is superimposed on a relatively low frequency modulation signal $S_M$. In the present application, signals having the above relationship will be described as carrier signal $S_C$ and modulation signal $S_M$, but the names of carrier signal $S_C$ and modulated signal $S_M$ are not limited to these names.

The switching power supply circuit 11 shown in FIG. 13 is driven via the driver circuit 11a, and drives switching elements M1 to M3 by providing drive signals $S_{M1}$, $S_{M2}$, and $S_{M3}$ from the driver circuit 11a, thereby outputting a second AC excitation current $I_E$. The switching elements M1 and M2 are P-channel MOSFETs, and the switching element M3 is an N-channel MOSFET. FIG. 13 shows an example of the configuration of the switching power supply circuit 11, but the configuration of the switching power supply circuit 11 is not limited to this example.

The switching power supply circuit 11 illustrated in FIG. 13 is a synchronous rectification type switching power supply, and includes two serially connected switching elements M2 and M3 between the power supply node Ni of the power source $V_0$ and the ground node Ng. The switching power supply circuit 11 also includes an inductor L1 placed between the intermediate node Na of the two switching elements M2, M3 and the output node No of the switching power supply circuit 11. The power supply $V_0$ is generated by decreasing the power supply from the battery 58. Since the impedance of the shunt resistor 12, to which the second AC excitation current $I_E$ is applied, is as small as several tens of micro-ohms, by using an element that satisfies the condition of a lower on-resistance as the switching element M3, it is possible to output power with lower power consumption compared to diode rectification.

Furthermore, the switching power supply circuit 11 includes a charge sampling switching element M1 connected in series between the DC power supply node Ni and the upstream switching element M2. The switching power supply circuit 11 further includes a capacitor C1 disposed in a charge sampling stage between an intermediate node Nb and a ground node Ng. The intermediate node Nb is located between the upstream switching element M2 and the charge sampling switching element M1.

Figure 14:
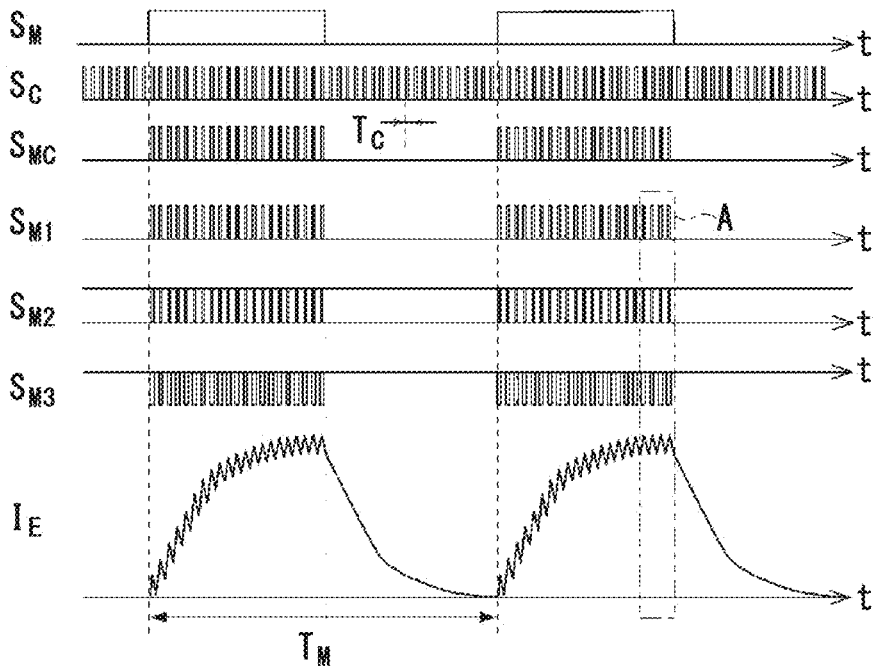
FIG. 14 is a time chart showing waveforms of various parts in the fifth embodiment.
Figure 15:
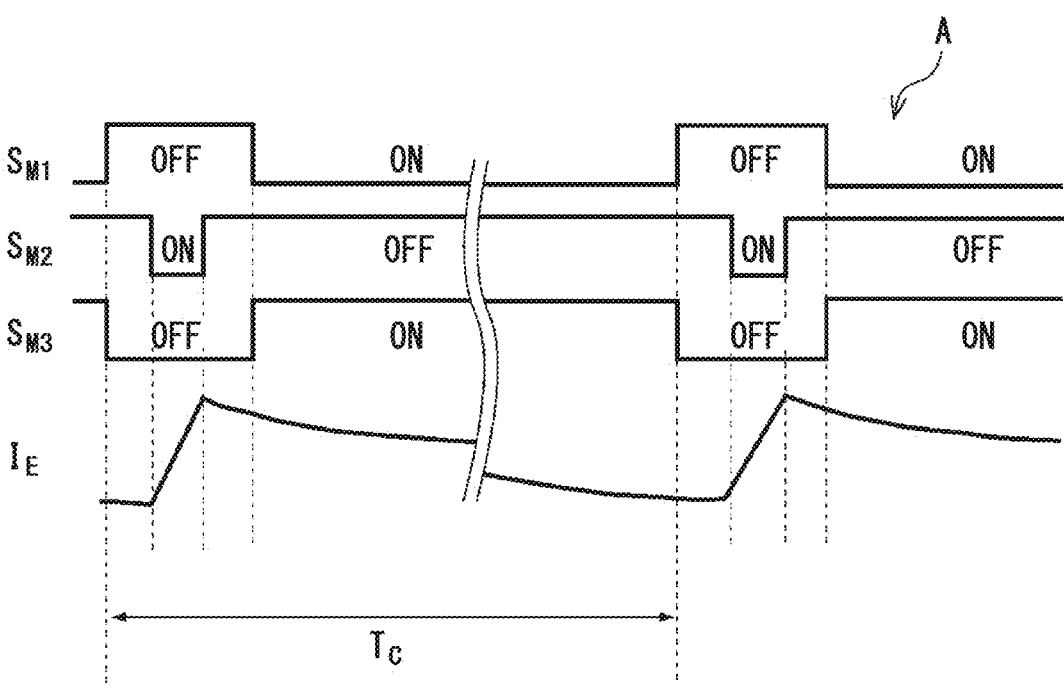
FIG. 15 is an enlarged view of a portion A in FIG. 14 according to the fifth embodiment.

FIG. 14 illustrates a timing chart of the AC excitation current $I_E$ output by the switching power supply circuit 11, and FIG. 15 illustrates an enlarged view of a part A thereof. When the driver circuit 11a receives the modulated carrier signal $S_{MC}$, the driver circuit 11a outputs a drive signal $S_{M1}$ that has a high voltage for a predetermined period of time from the generation timing of the carrier signal $S_C$, and at the same time outputs a drive signal $S_{M3}$ that has a voltage change complementary to the drive signal $S_{M1}$.

The drive signal $S_{M1}$ drives the gate of the switching element M1, which is the P-channel MOSFET. The drive signal $S_{M3}$ drives the gate of the switching element M3, which is the N-channel MOSFET. Therefore, the switching elements M1 and M3 are turned on or off simultaneously. Furthermore, the driver circuit 11a outputs the drive signal $S_{M2}$ that is at a low voltage only for a section of the time during which the drive signals $S_{M1}$ and $S_{M3}$ are OFF drive signals. The OFF drive signals may also be referred to as drive signals at an off level. The drive signal $S_{M2}$ is applied to the gate of the switching element M2, which is the P-channel MOSFET.

As shown in FIG. 15, when the switching elements M1 and M3 are in the on-state, the switching element M2 is maintained in the off-state. In this case, the capacitor C1 is charged from the node Ni through the switching element M1. Conversely, when the switching elements M1 and M3 are in the off-state, the switching element M2 is in the on-state only for a section of the time.

The switching power supply circuit 11 outputs the second AC excitation current $I_E$ from the capacitor C1 through the inductor L1 only for this section of the time. As a result, the second AC excitation current $I_E$ has a current waveform in which a small amplitude carrier signal $S_C$ is superimposed on a large amplitude waveform of the modulation signal $S_M$ with the frequency $f_M$, as shown in FIG. 14. The second AC excitation current $I_E$ may be preferably generated so that the amplitude of the waveform of the frequency of the modulation signal $S_M$ is greater than the amplitude of the frequency of the carrier signal $S_C$. That is, the switching power supply circuit 11 outputs a low-frequency second AC excitation current $I_E$ while maintaining a switching frequency based on the frequency fc of the carrier signal $S_C$ in order to ensure a predetermined supply current.

The switching power supply circuit 11 includes a charge sampling stage including the switching element M1 and the capacitor C1. This allows a large current to be supplied from the capacitor C1 of the charge sampling stage, and the switching power supply circuit 11 can be configured even if its power supply capacity is reduced. As a result, the switching power supply circuit 11 can be constructed at lower cost.

Furthermore, since a large current during operation of the switching power supply circuit 11 can be supplied from the capacitor C1 of the charge sampling stage, fluctuation in the power output of the switching power supply circuit 11 can be suppressed. As a result, interference with other circuits can be suppressed, and the resistance value $R_S$ of the shunt resistor 12 can be measured with high accuracy.

The modulated carrier signal $S_{MC}$ is, for example, a signal in which a relatively high frequency carrier signal $S_C$ is superimposed on a relatively low frequency modulation signal $S_M$. For this reason, it is sufficient to adjust the component values of the switching power supply circuit 11, such as the inductor L1 and capacitor C1, and various characteristics of the switching devices M1 to M3, to match the higher frequency carrier signal $S_C$ compared to the modulation signal $S_M$. If the switching devices M1 to M3 are selected to accommodate low frequencies, the component values of the inductor L1 and capacitor C1 will increase, resulting in higher costs. Therefore, by driving the switching power supply circuit 11 with the modulated carrier signal $S_{MC}$, as in the present embodiment, it is possible to easily and cost-effectively generate the AC excitation current $I_E$.

According to the configuration of the present embodiment, the switching power supply circuit 11 can generate the second AC excitation current $I_E$ by stepping down the voltage of the battery 58, which is powered by either the main battery or the auxiliary battery, thereby enabling a low power consumption and low-cost configuration. For example, it may be configured to directly excite using the carrier signal $S_C$ as it is. In this case, there is a possibility of high-frequency excitation due to the size constraints of the inductor L1 and capacitor C1 to be implemented, but it can be addressed by setting a larger inductance for the inductor L1 and a larger capacitance for the capacitor C1.

At this time, the error tends to increase due to the skin effect of the shunt resistor 12. However, to suppress this error, in the present embodiment, the carrier signal SC is modulated by the modulation signal $S_M$ and excitation is performed at the frequency of the modulation signal $S_M$. As a result, the error can be reduced, enabling the generation of a highly accurate the second AC excitation current $I_E$. According to this embodiment, since excitation is performed using a low-frequency modulation signal $S_M$ by a high-frequency carrier signal SC, the size of the inductor L1 and the capacitor C1 can be reduced, thereby allowing for a low-cost configuration.

Other Embodiments

The present disclosure is not limited to the embodiments described above, but can be implemented by various modifications, and can be applied to various embodiments without departing from a spirit of the present disclosure. For example, the following modifications or extensions can be performed. Each component is conceptual and is not limited to the above-described embodiments.

In one or more of the above embodiments, a configuration using two voltage measurement circuits 13 and 13a to detect the voltage across the shunt resistor 21 was explained. However, it is not limited to this configuration, and for example, three or more voltage measurement circuits can be used for redundant detection.

The control device and method described in the present disclosure may be implemented by a special purpose computer which is configured with a memory and a processor programmed to execute one or more particular functions embodied in computer programs of the memory. Alternatively, the control device described in the present disclosure and the method thereof may be realized by a dedicated computer configured as a processor with one or more dedicated hardware logic circuits. Alternatively, the control device and method described in the present disclosure may be realized by one or more dedicated computer, which is configured as a combination of a processor and a memory, which are programmed to perform one or more functions, and a processor which is configured with one or more hardware logic circuits. The computer program may be stored in a computer-readable non-transitory tangible recording medium as an instruction executed by a computer.

Although the present disclosure has been described in accordance with the embodiments, it is understood that the present disclosure is not limited such embodiments or structures described in the embodiments. The present disclosure also includes various modifications and changes within the range of equivalency. Furthermore, various combination and formation, and other combination and formation including one, more than one or less than one element may be made in the present disclosure.

What is claimed is:

1. A shunt-based current sensor configured to execute redundancy detection of a load current flowing through a load by using a shunt resistor, the shunt-based current sensor comprising:

a reference resistor connected to the shunt resistor in series;

a current excitation circuit configured to generate an AC excitation current and supply the AC excitation current to the shunt resistor and the reference resistor;

at least two voltage measurement circuits configured to measure a voltage across the shunt resistor; and a signal processing circuit configured to execute signal processing based on respective measurement voltages of the at least two voltage measurement circuits, wherein the signal processing circuit is further configured to be operated in a load current redundancy detection mode or a shunt resistance measurement mode, the load current redundancy detection mode is a mode in which the redundancy detection of the load current is executed via measurement of the voltage across the shunt resistor by using the at least two voltage measurement circuits, on a condition that:

the AC excitation current is not flowing to the reference resistor and the shunt resistor; and the load current is flowing from the load to the shunt resistor, and the shunt resistance measurement mode is a mode in which a resistance value of the shunt resistor is detected based on a voltage across the reference resistor and the voltage across the shunt resistor measured by the at least two voltage measurement circuits, respectively, on a condition that the AC excitation current is flowing from the current excitation circuit to the reference resistor and the shunt resistor.

2. The shunt-based current sensor according to claim 1, wherein the signal processing circuit includes an AC measurement path configured to execute synchronous demodulation of respective measurement results of the at least two voltage measurement circuits, and the signal processing circuit in the shunt resistance measurement mode is configured to calculate the resistance value of the shunt resistor by:

executing the synchronous demodulation of respective measurement signals of the at least two voltage measurement circuits through the AC measurement path to detect an AC component of the AC excitation current; and detecting a component acquired by dividing the resistance value of the shunt resistor with the resistance value of the reference resistor; and multiplying the component by a preliminarily stored reference resistance value of the reference resistor.

3. The shunt-based current sensor according to claim 2, wherein the signal processing circuit further includes a DC measurement path having a low-pass filter configured to limit a bandwidth of each of the respective measurement signals of the at least two voltage measurement circuits, and the signal processing circuit in the load current redundancy detection mode is configured to detect the load current based on a signal acquired through the low-pass filter.

4. The shunt-based current sensor according to claim 1, wherein the reference resistor is one of reference resistors including a first reference resistor and a second reference resistor, the first reference resistor and the second reference resistor are connected to the shunt resistor in series, the signal processing circuit in the shunt resistance measurement mode is configured to execute the signal processing including a first measurement process and a second measurement process, the first measurement process is a process in which the current excitation circuit supplies a first AC excitation current to the first reference resistor and the second reference resistor, and the at least two voltage measurement circuits detect a voltage across the first reference resistor and a voltage across the second reference resistor, and the second measurement process is a process in which the current excitation circuit supplies a second AC excitation current to the second reference resistor and the shunt resistor, and the at least two voltage measurement circuits detect the voltage across the second reference resistor and a voltage across the shunt resistor.

5. The shunt-based current sensor according to claim 4, wherein the signal processing circuit in the shunt resistance measurement mode is configured to calculate the resistance value of the shunt resistor by:

executing synchronous demodulation of respective outputs of two voltage measurement circuits;

extracting a main component of each of the first AC excitation current and the second AC excitation current;

acquiring a first calculated value by dividing a resistance value of the shunt resistor derived from an output of the synchronous demodulation with a resistance value of the second reference resistor, acquiring a second calculated value by dividing a resistance value of the second reference resistor derived from an output of the synchronous demodulation with the resistance value of the first reference resistor;

acquiring a third calculated value by multiplying the first calculated value by the second calculated value; and multiplying the third calculated value by a preliminarily stored reference resistance value of the first reference resistor.

6. The shunt-based current sensor according to claim 5, wherein the signal processing circuit in the shunt resistance measurement mode is further configured to calculate the load current by applying a low-pass filter to an output of each of the at least two voltage measurement circuits, on a condition that the at least two voltage measurement circuits are measuring the resistance value of the shunt resistor.

7. The shunt-based current sensor according to claim 6, wherein the resistance value of the first reference resistor has less amount of drift over time than the resistance value of the second reference resistor and the resistance value of the shunt resistor.

8. The shunt-based current sensor according to claim 6, further comprising:

a comparator configured to compare two measurement values acquired from the at least two voltage measurement circuits in the load current redundancy detection mode, and detect an abnormality in a measurement path or the at least two voltage measurement circuits, on a condition that a difference between the two measurement values exceeds an arbitrary abnormal value.

9. The shunt-based current sensor according to claim 6, wherein the shunt resistor is elongated in a lengthwise direction of the shunt resistor, and is made of copper material with an alloy sandwiched in a middle portion of the shunt resistor in the lengthwise direction, measurement points for the at least two voltage measurement circuits that measure the voltage across the shunt resistor are provided with two sets of differential input points, one of the two sets is located at a boundary between the alloy and the copper material, where the alloy is sandwiched, and another one of the two sets is located farther out in the lengthwise direction from the one of the two sets.

10. The shunt-based current sensor according to claim 6, further comprising:

a control circuit configured to output an AC carrier signal and an AC modulation signal, wherein the current excitation circuit includes a switching power supply circuit having a switching element, and the switching power supply circuit is configured to:

drive the switching element through a modulated carrier signal acquired by multiplying the AC carrier signal with the AC modulation signal; and output a power supply including the AC excitation current induced by the modulated carrier signal.

11. The shunt-based current sensor according to claim 10, wherein the first reference resistor and the at least two voltage measurement circuits mount on a same integrated circuit.

12. The shunt-based current sensor according to claim 11, wherein the first reference resistor is made of tantalum nitride, titanium nitride, or nitride.

* * * * *